(12) United States Patent
Murayama

(10) Patent No.: US 7,476,903 B2
(45) Date of Patent: Jan. 13, 2009

(54) SEMICONDUCTOR LIGHT-EMITTING DEVICE

(75) Inventor: Masahiro Murayama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 61 days.

(21) Appl. No.: 11/463,910

(22) Filed: Aug. 11, 2006

(65) Prior Publication Data

US 2007/0037305 A1     Feb. 15, 2007

(30) Foreign Application Priority Data

Aug. 11, 2005   (JP)   ............................ 2005-233371

(51) Int. Cl.
*H01L 29/26*   (2006.01)
(52) U.S. Cl. .......................................... 257/79; 257/82
(58) Field of Classification Search ................. 257/103, 257/94, 95, 96, 97, E25.032, 79, 82, 88, E33.001, 257/E31.099, E31.105
See application file for complete search history.

(56) References Cited

U.S. PATENT DOCUMENTS

| | | | |
|---|---|---|---|
| 6,841,409 B2 * | 1/2005 | Onishi ......................... 438/37 |
| 6,841,808 B2 * | 1/2005 | Shibata et al. .............. 257/190 |
| 7,095,051 B2 * | 8/2006 | Nagahama et al. ............ 257/79 |
| 7,314,672 B2 * | 1/2008 | Kimura ....................... 428/698 |
| 7,323,724 B2 * | 1/2008 | Sugimoto et al. ............. 257/99 |
| 2005/0098789 A1 * | 5/2005 | Kozaki ......................... 257/97 |
| 2006/0131604 A1 * | 6/2006 | Kozaki ........................ 257/103 |
| 2006/0192209 A1 * | 8/2006 | Maeda et al. .................. 257/79 |
| 2006/0192211 A1 * | 8/2006 | Kako et al. .................... 257/79 |
| 2006/0273324 A1 * | 12/2006 | Asai et al. ..................... 257/79 |

FOREIGN PATENT DOCUMENTS

| JP | 2000-312051 A | 11/2000 |
|---|---|---|
| JP | 2003-142769 A | 5/2003 |

* cited by examiner

*Primary Examiner*—Thao Le
(74) *Attorney, Agent, or Firm*—Keating & Bennett, LLP

(57) ABSTRACT

A semiconductor light-emitting device and method for manufacturing the semiconductor light-emitting device includes a mask layer etching process on first and second mask layers provided on a Group-III nitride-based compound semiconductor substrate, the mask layer with a higher etching rate being closer to the p-type semiconductor layer; a semiconductor layer etching process; a side-etching process that selectively etches the side of the mask layer with the high etching rate to define a groove portion with a portion of the p-type semiconductor layer exposed; a $ZrO_2$ film forming process that forms a $ZrO_2$ film so as to cover the exposed p-type semiconductor layer; an $Al_2O_3$ film forming process that forms an $Al_2O_3$ film so as to cover the $ZrO_2$ film; a mask layer removing process; and an electrode layer forming process. The method for manufacturing the semiconductor light-emitting device increases the yield of lift-off with respect to the p-type semiconductor layer and can produce a semiconductor light-emitting device with an improved voltage resistance.

5 Claims, 13 Drawing Sheets

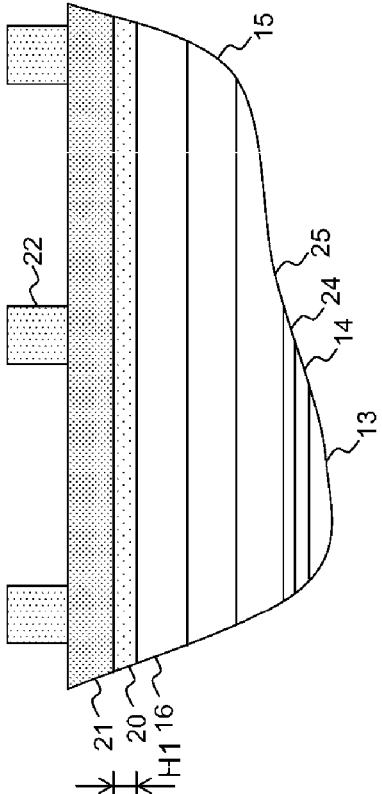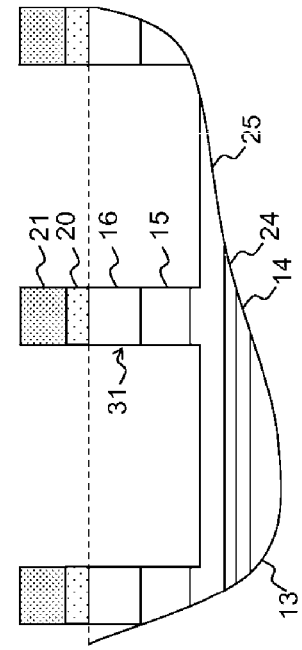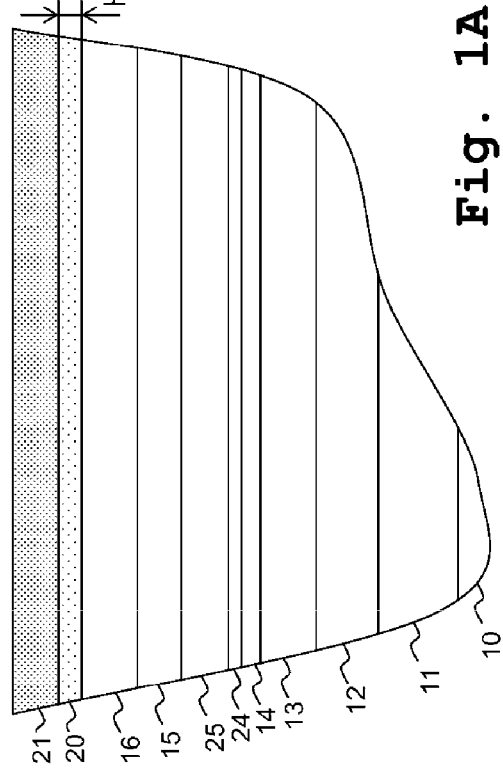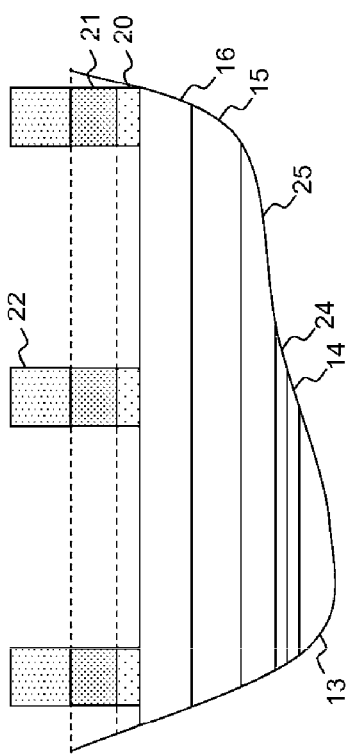
Fig. 1A
Fig. 1B
Fig. 1C
Fig. 1D

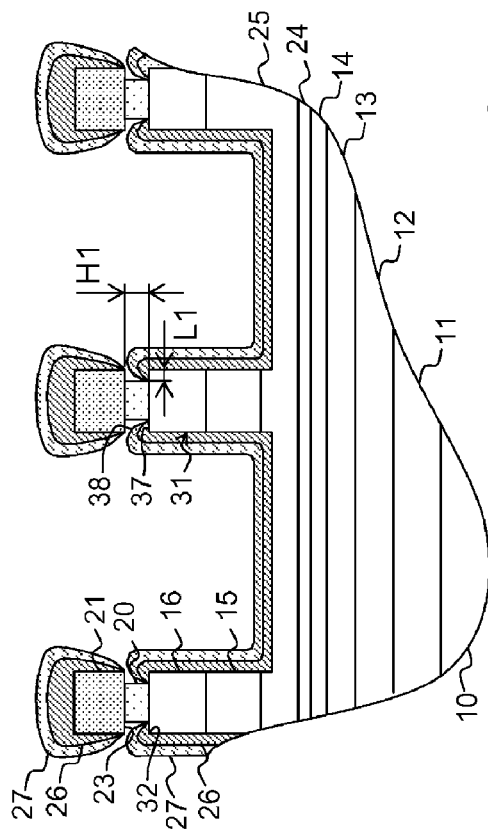
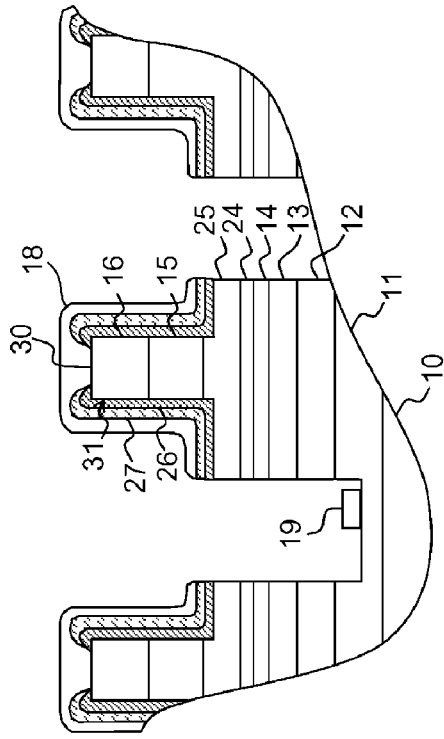
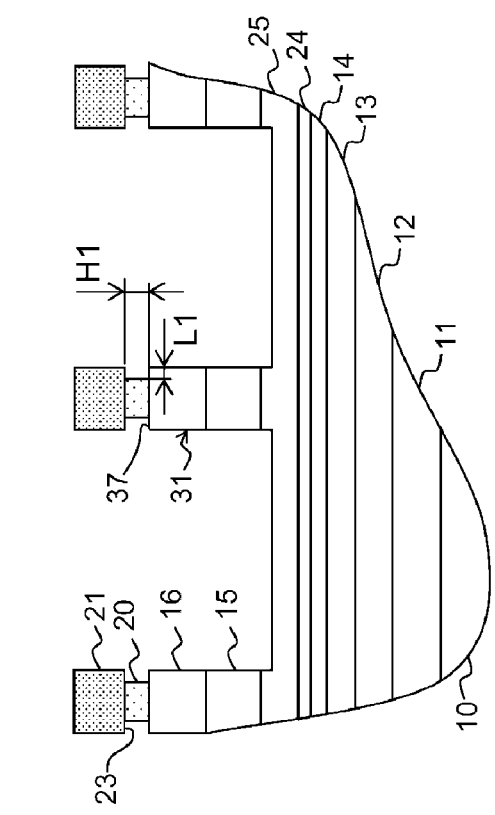
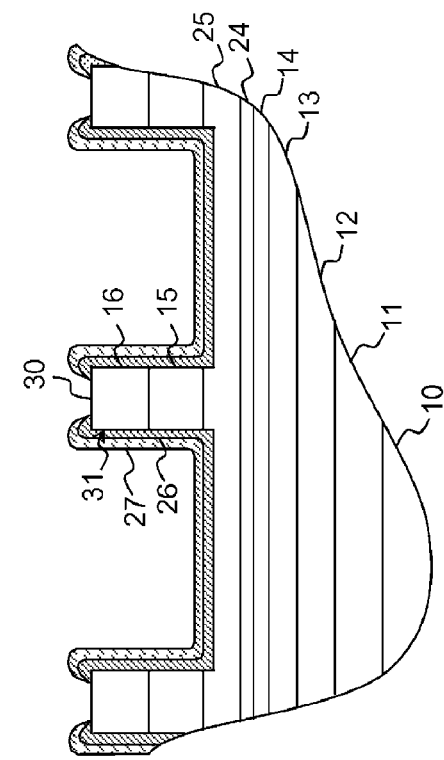
Fig. 2A
Fig. 2B
Fig. 2C
Fig. 2D

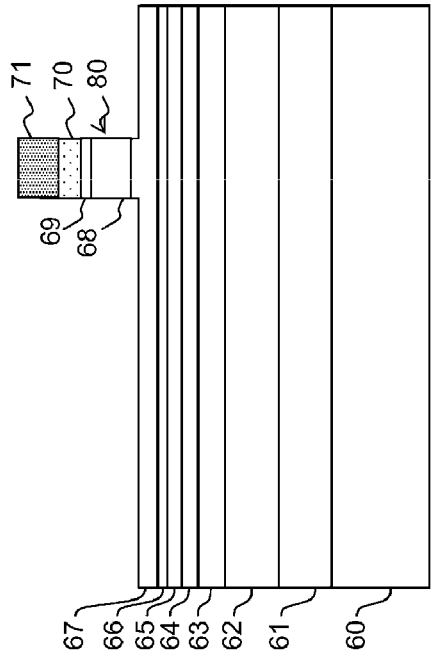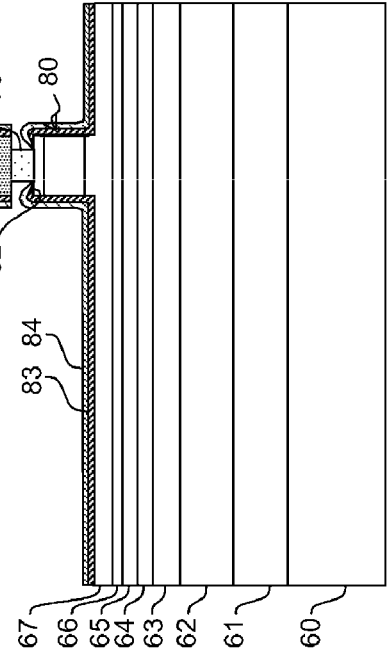
Fig. 9A
Fig. 9B
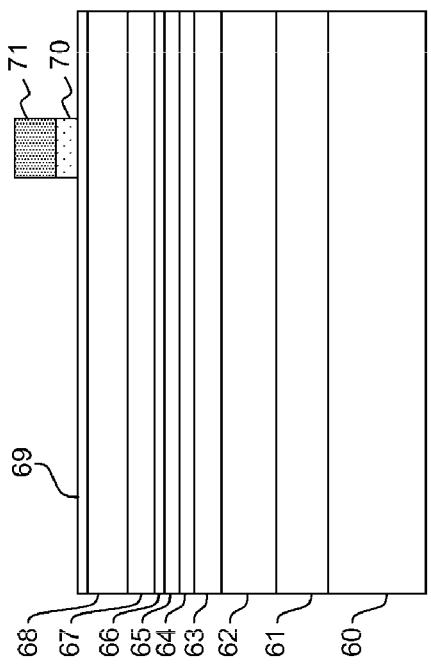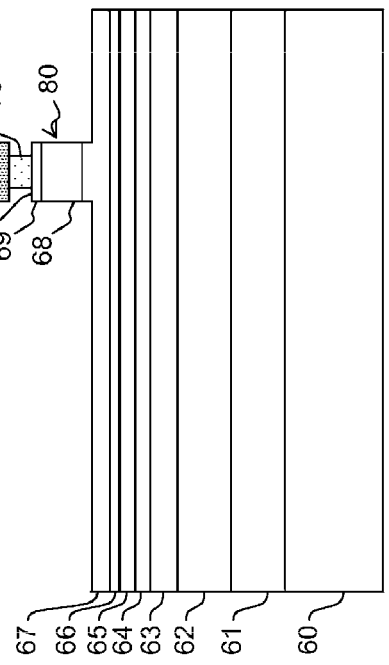
Fig. 9C
Fig. 9D
(d)

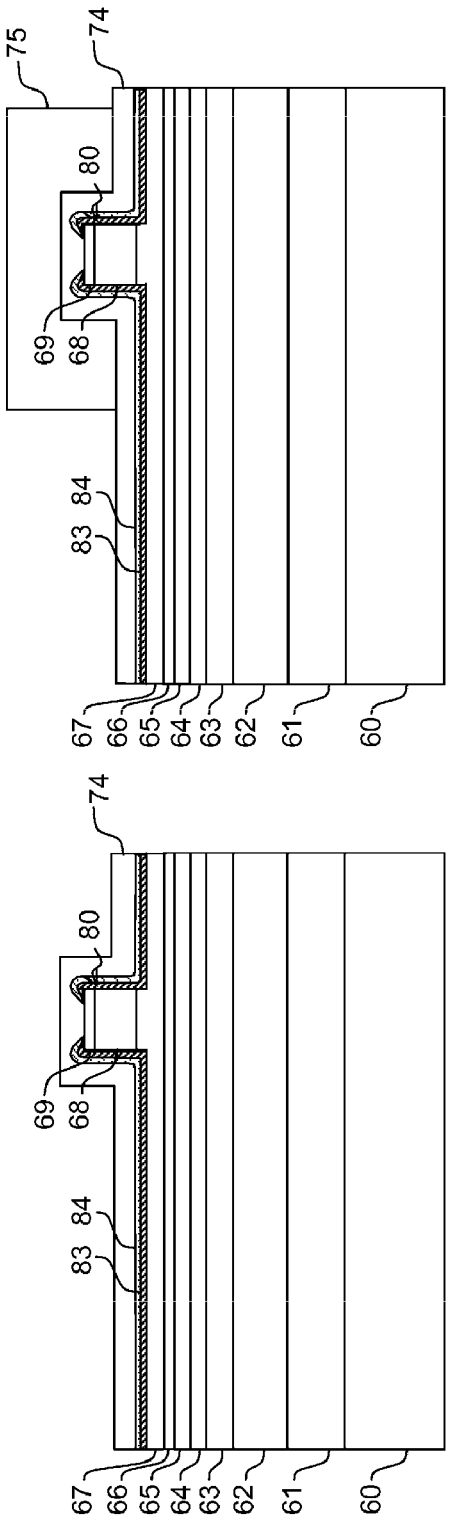
Fig. 10A
Fig. 10B
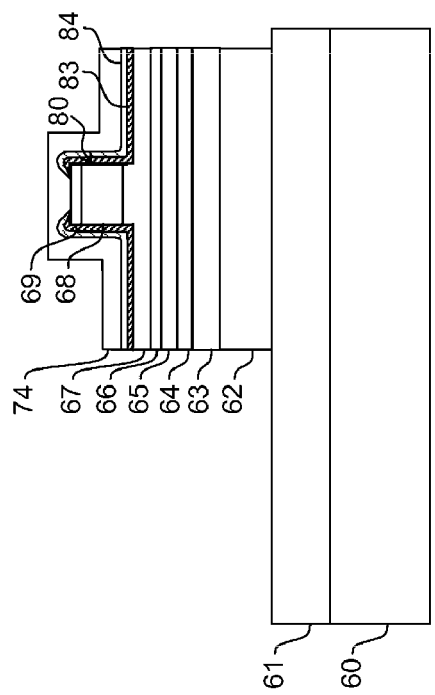
Fig. 10C
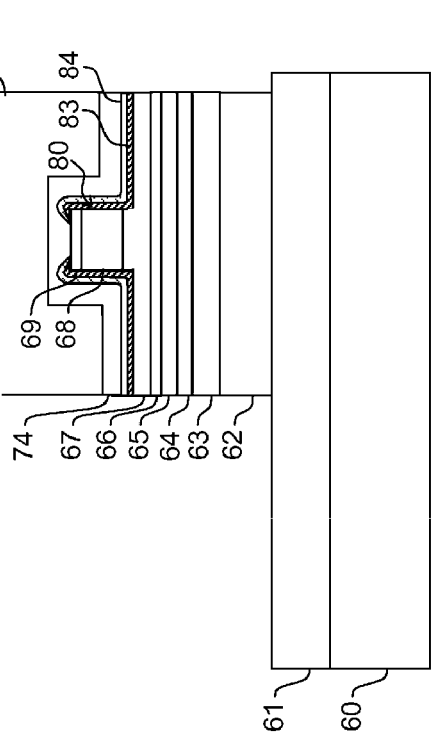
Fig. 10D

SEMICONDUCTOR LIGHT-EMITTING DEVICE

BACKGROUND OF THE INVENTION

1. Field of the Invention

The present invention relates to a method for manufacturing a semiconductor light-emitting device equipped with a semiconductor light-emitting element and to a semiconductor light-emitting device.

2. Description of the Related Art

Conventionally, a semiconductor light-emitting device composed of a Group-III nitride-based compound semiconductor expressed by $Al_xGa_yIn_{1-x-y}N$ (where, $0 \leq x \leq 1$; $0 \leq y \leq 1$; $0 \leq x+y \leq 1$) has been manufactured as follows.

FIG. 7 shows a schematic block diagram of a semiconductor light-emitting device obtained by a conventional manufacturing method.

In a conventional process of manufacturing a semiconductor light-emitting device, an $SiO_2$ film is formed on the top surface of p-GaN contact layer 46 of a semiconductor substrate having n-GaN contact layer 41, n-AlGaN clad layer 42, n-GaN guide layer 43, InGaN/GaN active layer 44, p-AlGaN electronic block layer 55, p-GaN guide layer 56, p-AlGaN clad layer 45, and p-GaN contact layer 46 successively arranged on a substrate 40. Thereafter, striped resist patterns are formed on the $SiO_2$ film.

Next, with the resist patterns used as a mask, the $SiO_2$ film is etched. Thereafter, the resist patterns are peeled off. With the resist pattern of an $SiO_2$ film exposed by peeling off the resist pattern used as the mask, etching is carried out on the p-GaN contact layer 46 and p-AlGaN clad layer 45 as well as part of the p-GaN guide layer 56.

Then, in order to form the subsequent n-type electrode layer, the n-GaN contact layer 41 is removed by dry etching so as to expose a portion of the n-GaN contact layer 41. An insulation film 47 is provided to cover the surface of the semiconductor layer including the p-AlGaN clad layer 45 and the p-GaN contact layer 46 together with the resist pattern of the $SiO_2$ film. The insulation film 47 may be either a $ZrO_2$ film or an $Al_2O_3$ film.

Thereafter, the $SiO_2$ film is removed together with the insulation film 47 by a hydrofluoric acid treatment. In addition, the insulation film 47 at the portion where the n-type electrode layer is later vapor-deposited is removed by dry etching and the n-GaN contact layer 41 is exposed.

Then, a p-type electrode layer 48 is provided to cover the top surface 52 of the p-GaN contact layer 46 exposed by removal of the insulation film 47. In addition, an n-type electrode layer 49 is provided on the exposed top layer of the n-GaN contact layer 41, and the substrate 40 and all of the layers are cleaved to obtain a semiconductor light-emitting device 500 (for example, see Japanese Unexamined Patent publications 2000-312051 and 2003-142769).

The conventional semiconductor light-emitting device 500 obtained in this way includes, in a semiconductor light-emitting device composed of a Group-III nitride-based compound semiconductor expressed by $Al_xGa_yIn_{1-x-y}N$ (where, $0 \leq x \leq 1$; $0 \leq y \leq 1$; $0 \leq x+y \leq 1$), substrate 40, n-GaN contact layer 41 as an n-type semiconductor layer arranged on the substrate 40, n-AlGaN clad layer 42 and n-GaN guide layer 43, InGaN/GaN active layer 44 as an active layer arranged on the n-GaN guide layer 43, p-AlGaN electronic block layer 55 which is located on the InGaN/GaN active layer 44 and serves as a p-type semiconductor layer with a mesa portion 53 protruding above the InGaN/GaN active layer 44, p-GaN guide layer 56, p-AlGaN clad layer 45 and p-GaN contact layer 46, insulation film 47 that covers the mesa portion 53 so as to expose the top surface 52 of the mesa portion 53, p-type electrode layer 48 as an electrode layer which covers the mesa portion 53 from above the insulation film 47 and electrically connects to the p-GaN contact layer 46, and an n-type electrode layer 49 which electrically connects to the n-GaN contact layer 41.

However, if a $ZrO_2$ film is used as the insulation film 47, the $ZrO_2$ film easily comes off because it has poor adhesion with respect to Pd/Au serving as the p-type electrode layer. On the other hand, if an $Al_2O_3$ film is used as the insulation film 47, while the $Al_2O_3$ film provides good adhesion with respect to Pd/Au serving as the p-type electrode layer, there exists a large difference between the refraction index of $Al_2O_3$ film (refraction index: 1.8) and the refraction index of p-GaN contact layer 46 (refraction index: 2.5). This excessively increases the locked-in effect of the light emitted in the InGaN/GaN active layer 44.

If the locked-in effect of the light is excessively increased, light is concentrated in the vicinity of the middle of the mesa portion 53. This makes the refraction index even higher in the vicinity of the middle of the mesa portion 53, which in turn causes generation of an undesirable transverse mode, resulting in an unstable kink level. That is, it becomes difficult to generate single-transverse-mode oscillation by optimizing the design of the width of mesa portion 53 alone.

Furthermore, although there is a method to make the $Al_2O_3$ film sufficiently thinner than the light-emitting wavelength, if the $Al_2O_3$ film is too thin, it is unable to keep the film uniform, making it impossible to maintain adhesion to Pd/Au.

Furthermore, because in the conventional method of manufacturing a semiconductor light-emitting device, when the insulation film 47 is formed, the insulation film 47 completely covers the $SiO_2$ film and penetration of the etchant into the $SiO_2$ film is blocked. Consequently, the lift-off yield with respect to the p-GaN contact layer 46, which is the p-type semiconductor layer, is excessively low.

In addition, because in the semiconductor light-emitting device manufactured by a conventional method, the insulation film 47 is provided only on the side surface of the mesa portion 53 and the p-type electrode layer 48 shown in FIG. 7 comes in contact with the entire top surface 52 of the mesa portion 53. Consequently, in the event that the semiconductor light-emitting device 500 is driven, as shown by the arrows, current from the p-type electrode layer 48 is likely to flow to the vicinity of the side surface of the mesa portion 53 and an electric field is concentrated at the edge portion 54 of the mesa portion 53. The electric field concentration at the edge portion 54 of the mesa portion 53 may damage the semiconductor light-emitting device 500.

SUMMARY OF THE INVENTION

In order to overcome the problems described above, preferred embodiments of the present invention provide a semiconductor light-emitting device which minimizes the electric field concentration at the edge portion of the mesa portion on the p-type semiconductor layer by electric current from the p-type electrode layer so as improve voltage resistance, achieve good adhesion between the insulation film and the p-type electrode layer, and a stabilized kink level. Furthermore, preferred embodiments of the present invention provide a method for manufacturing a semiconductor light-emitting device which can increase the lift-off yield with respect to the p-type semiconductor layer.

The inventor of preferred embodiments of the present invention has been able to provide a gap in the insulation film by providing first and second mask layers wherein the first mask layer closer to the p-type semiconductor layer has a higher etching rate. Furthermore, the two layer insulation film includes a $ZrO_2$ film and an $Al_2O_3$ film.

Specifically, the method for manufacturing a semiconductor light-emitting device according a preferred embodiment of the present invention includes a mask-layer forming process that forms the first and second mask layers wherein the first mask layer closer to a p-type semiconductor layer has a higher etching rate, the Group-III nitride-based compound semiconductor whose n-type semiconductor layer, active layer, and p-type semiconductor layer are arranged in sequence on a substrate are expressed as $Al_xGa_yIn_{1-x-y}N$ (where, $0 \leq x \leq 1$; $0 \leq y \leq 1$; $0 \leq x+y \leq 1$); a mask layer etching process that forms specified resist patterns on the two mask layers by etching both mask layers with the resist patterns used as mask, and then, peeling the resist patterns from the two mask layers; a semiconductor layer etching process that etches the p-type semiconductor layer with the resist patterns of the two mask layers as a mask; a side-etching process that selectively etches the side of the first mask layer having the higher etching rate of the two mask layers after the semiconductor layer etching process and that forms a groove portion with a portion of the p-type semiconductor layer exposed; a $ZrO_2$ film forming process that forms a $ZrO_2$ film so as to cover the p-type semiconductor layer exposed in the groove portion formed by the side-etching process; an $Al_2O_3$ film forming process that forms an $Al_2O_3$ film so as to cover the $ZrO_2$ film formed by the $ZrO_2$ film forming process; a mask layer removing process that removes the remaining two mask layers from the p-type semiconductor layer after the $Al_2O_3$ film forming process; and an electrode layer forming process that forms an electrode layer so as to cover the entire surface of the p-type semiconductor layer exposed by the mask layer removing process.

By forming the first and second mask layers wherein the first mask layer closer to the p-type semiconductor layer has a higher etching rate in the mask layer forming process, it becomes possible to form a groove portion on the relevant side by selectively etching the side surface of the mask layer having a higher etching rate in the side etching process. In the $ZrO_2$ film forming process and the $Al_2O_3$ film forming process, the groove portion is formed such that the groove shields the $ZrO_2$ film and $Al_2O_3$ film and the $ZrO_2$ film and $Al_2O_3$ film only partially enter the groove portion. Consequently, it becomes possible to provide a gap in an insulation film so as to prevent the $ZrO_2$ film and $Al_2O_3$ film from covering the entire surface of the mask layer. Therefore, in the event that the two mask layers are removed from the p-type semiconductor layer in the subsequent process, the two mask layers can be removed at the cut line. Consequently, it is possible to increase the lift-off yield from the p-type semiconductor layer. In addition, by allowing the $ZrO_2$ film and the $Al_2O_3$ film to enter the groove portion, the edge portion of the mesa portion on the p-type semiconductor layer formed in the semiconductor layer etching process is covered by the $ZrO_2$ film and the $Al_2O_3$ film to minimize concentration of an electric field at the relevant bridge portion, and a semiconductor light-emitting device can be manufactured with improved voltage resistance. Furthermore, by forming a two-layer insulation film with the $ZrO_2$ film as the lower layer and the $Al_2O_3$ film as the upper layer by the $ZrO_2$ film forming process and the $Al_2O_3$ film forming process, adhesion between the p-type electrode layer and the insulation film is improved by the upper layer $Al_2O_3$ film, and by achieving consistency between the refraction index of the $ZrO_2$ film and the refraction index of the p-type semiconductor layer by the lower-layer $ZrO_2$ film, locked-in effects of light can be alleviated. As a result, a semiconductor light-emitting device having a stabilized kink level can be manufactured.

In the mask layer forming process of the method for manufacturing a semiconductor light-emitting device, it is desirable that the etching rate ratio of one layer to the other layer of the two mask layers is 5 or more. In addition, it is more preferable that the etching rate ratio of one layer to the other layer of the two mask layers is 10 or more.

By setting the etching rate ratio of the two mask layers to 5 or more, the etching rate in the side etching process of the mask layer with the lower etching rate can be decreased to an extremely small amount and the depth of the groove portion can be adjusted. Consequently, in the $ZrO_2$ film forming process and $Al_2O_3$ film forming process, sufficient entry rates of the $ZrO_2$ film and the $Al_2O_3$ film can be achieved and the effects of minimizing the concentration of an electric field at the edge portion of the mesa portion on the p-type semiconductor layer can be increased.

In addition, it is preferable that in the mask layer forming process of the method for manufacturing the semiconductor light-emitting device, the mask layer with the higher etching rate of the two mask layers is an oxide or nitride formed by spin-coating, heat-hardening, ultraviolet-curing after spin-coating, or laser ablation, and the mask layer with the lower etching rate of the two mask layers is an oxide or nitride formed by sputtering or plasma enhanced chemical vapor deposition.

By forming the two mask layers by any of the above-mentioned oxides or nitrides, a sufficient difference can be achieved between the etching rates, and the etching rate in the side etching process of the mask layer with the lower etching rate can be decreased to an extremely small amount and the depth of the groove portion can be adjusted in the side etching process. Consequently, in the $ZrO_2$ film forming process and $Al_2O_3$ film forming process, sufficient entry rates of the $ZrO_2$ film and the $Al_2O_3$ film can be achieved and the effects of minimizing the concentration of an electric field at the edge portion of the mesa portion on the p-type semiconductor layer can be increased.

In addition, the layer thickness of the mask layer with the higher etching rate is from about 10 nm to about 500 nm in the mask layer forming process of the method for manufacturing the semiconductor light-emitting device.

By making the layer thickness of the mask layer with the higher etching rate from about 10 nm to about 500 nm in the mask layer forming process, it is possible to angle the inner side wall surface along the edge of the top surface of the mesa portion of the $ZrO_2$ film and the $Al_2O_3$ film to towards the top of the mesa portion. Consequently, it becomes possible to manufacture a semiconductor light-emitting device with minimized stress concentration that occurs between the $ZrO_2$ film and the $Al_2O_3$ film and the top surface of the mesa portion. In addition, in the event that a mask layer with a low etching rate is formed by sputtering or plasma enhanced chemical vapor deposition, it is possible to allow the mask layer with the higher etching rate to have effects to alleviate plasma damage to the p-type semiconductor layer.

In addition, a semiconductor light-emitting device according to a preferred embodiment of the present invention is a semiconductor light-emitting device composed of a Group-III nitride-based compound semiconductor expressed by $Al_xGa_yIn_{1-x-y}N$ (where, $0 \leq x \leq 1$; $0 \leq y \leq 1$; $0 \leq x+y \leq 1$) and has a substrate, an n-type semiconductor layer arranged on the substrate, an active layer arranged on the n-type semiconductor layer, a p-type semiconductor layer arranged on the active layer and having a mesa portion formed so as to protrude above the active layer, a $ZrO_2$ film that covers the mesa portion from the inner side along the edge of the top surface to the side surface of the mesa portion so as to expose the top surface of the mesa portion, an $Al_2O_3$ film that covers the $ZrO_2$ film so to expose the top surface of the mesa portion, and an electrode layer that covers the mesa portion from above the $ZrO_2$ film and the $Al_2O_3$ film and electrically connects to the p-type semiconductor layer.

By covering the mesa portion with the $ZrO_2$ film and the $Al_2O_3$ film from the inner side along the edge of the top surface to the side surface of the mesa portion so as to expose the top surface of the mesa portion, it is possible to minimize an electric field concentration at the edge portion of the mesa portion on the p-type semiconductor layer by the current from the electrode layer and improve the voltage resistance. Consequently, the semiconductor light-emitting device according to preferred embodiments of the present invention can provide a high output. Furthermore, by forming an insulation film having two layers including a lower $ZrO_2$ film and an upper $Al_2O_3$ film, the semiconductor light-emitting device according to the present preferred embodiment has the adhesion between the p-type electrode layer and the insulation layer improved by the upper-layer $Al_2O_3$ film, and by achieving consistency between the refraction index of the $ZrO_2$ film and the refraction index of the p-type semiconductor layer by the lower-layer $ZrO_2$ film, locked-in effects of light can be alleviated. As a result, a semiconductor light-emitting device having a stabilized kink level can be manufactured.

In addition, in the semiconductor light-emitting device, it is preferable that the inner side wall surface along the edge of the top surface of the mesa portion of the $ZrO_2$ film and the $Al_2O_3$ film is angled towards the top of the mesa portion.

By angling the inner side wall surface along the top surface of the mesa portion of the $ZrO_2$ film and the $Al_2O_3$ film towards the top of the mesa portion, a smooth curve is achieved from the top surface of the mesa portion to the wall surface and no stress concentration due to a difference of thermal expansion ratios occurs between the $ZrO_2$ film and the $Al_2O_3$ film. Consequently, the semiconductor light-emitting device according to the present preferred embodiment has a long service life.

In addition, in the semiconductor light-emitting device, it is preferable that the wall surface is formed in a two-step tiered structure.

By making the inner side wall surface along the top surface of the mesa portion of the $ZrO_2$ film and the $Al_2O_3$ film, the thickness of the mesa portion of the $ZrO_2$ film and the $Al_2O_3$ film between the edge portion of the mesa portion and the electrode layer can be increased. Consequently, sufficient insulation between the electrode layer and the edge portion of the mesa portion by the $ZrO_2$ film and the $Al_2O_3$ film is achieved and minimizing effects of electric field concentration at the edge portion of the mesa portion on the p-type semiconductor layer can be increased.

Furthermore, in the semiconductor light-emitting device, it is preferable that the width from the edge of the top surface of the mesa portion where the $ZrO_2$ film and the $Al_2O_3$ film come in contact with the top surface of the mesa portion is from about 0 to about 0.5 μm.

By setting the width from the edge of the top surface of the mesa portion at the connections between the $ZrO_2$ film and the $Al_2O_3$ film and the top surface of the mesa portion from about 0 to about 0.5 μm, minimizing effects of the electric field concentration at the edge portion of the mesa portion on the p-type semiconductor layer can be increased while a sufficient amount of current from the p-type electrode layer to the p-type semiconductor layer is achieved.

The preferred embodiments of the present invention can provide a semiconductor light-emitting device which can minimize the electric field concentration by the current from the p-type electrode layer on the edge portion of the mesa portion on the p-type semiconductor layer and improve the voltage resistance, and at the same time, achieve good adhesion between the insulation layer and the p-type electrode layer and stabilize the kink level. Furthermore, preferred embodiments of the present invention can provide a method for manufacturing a semiconductor light-emitting device which can minimize the electric field concentration by the current from the p-type electrode layer on the edge portion of the mesa portion on the p-type semiconductor layer and improves voltage resistance, and at the same time, which achieves good adhesion between the insulation layer and the p-type electrode layer and stabilizes the kink level, as well as a method for manufacturing a semiconductor light-emitting device which can improve the lift-off yield for the p-type semiconductor layer.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 1A to 1D are schematic representations that show a portion of the process up to forming a p-type electrode layer and an n-type electrode layer in the method for manufacturing a semiconductor light-emitting device according to a first preferred embodiment of the present invention.

FIGS. 2A to 2D are schematic representations that show a portion of the process up to forming a p-type electrode layer and an n-type electrode layer in the method for manufacturing the semiconductor light-emitting device according to the first preferred embodiment of the present invention.

FIGS. 9A to 9D are schematic representations that show a portion of the process to obtain a semiconductor light-emitting device by the method for manufacturing a semiconductor light-emitting device according to the second preferred embodiment of the present invention.

FIGS. 10A to 10D are schematic representations that show a portion of the process to obtain a semiconductor light-emitting device by the method for manufacturing a semiconductor light-emitting device according to the second preferred embodiment.

DETAILED DESCRIPTION OF PREFERRED EMBODIMENTS

Figure 3A:
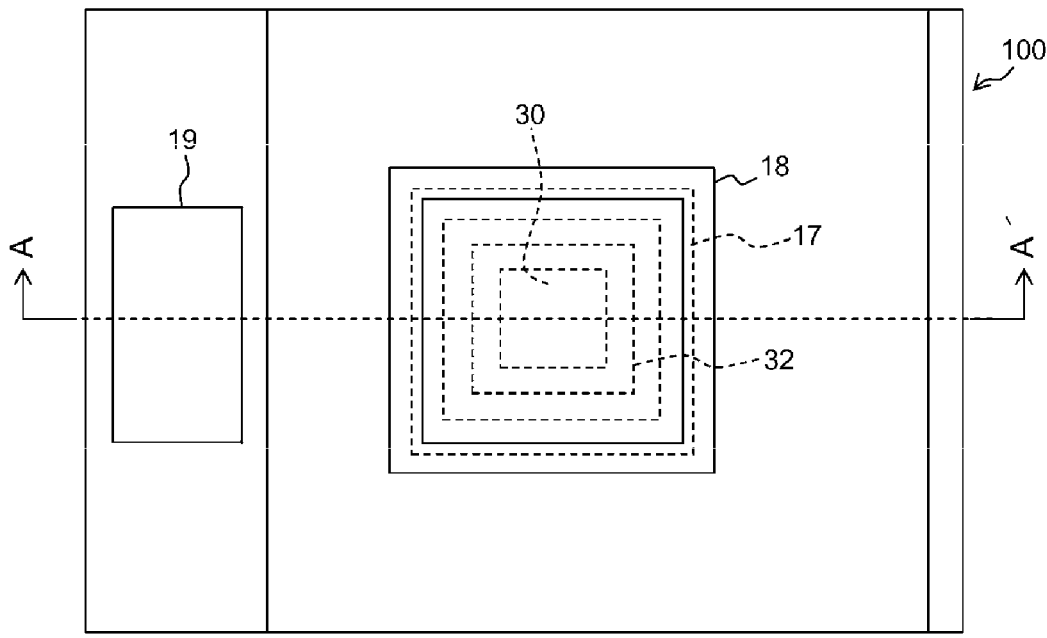
FIGS. 3A and 3B are schematic block diagrams of a semiconductor light-emitting device according to another preferred embodiment of the present invention.

Referring to the drawings, preferred embodiments of the present invention will be described in detail as follows. It is noted that the present invention is not to be limited to the preferred embodiments described below.

First Preferred Embodiment

First, explanation will be made of the method for manufacturing a semiconductor light-emitting device according to the present preferred embodiment. FIGS. 1A to 1D and FIGS. 2A to 2D are schematic representations that show processes before forming the p-type electrode layer and the n-type electrode on a Group-III nitride-based compound semiconductor wafer expressed as $Al_xGa_yIn_{1-x-y}N$ (where, $0 \leq x \leq 1$; $0 \leq y \leq 1$; $0 \leq x+y \leq 1$). FIGS. 1A to 1D and FIGS. 2A to 2D indicate schematic cross-sectional views of a semiconductor light-emitting device in each process. It is noted that, in each figure, only a portion that requires the explanation of the method for manufacturing a semiconductor light-emitting device is described.

Mask Layer Forming Process

In the manufacturing method of a semiconductor light-emitting device according to the present preferred embodiment, a semiconductor light-emitting device of a Group-III nitride-based compound semiconductor expressed as $Al_xGa_yIn_{1-x-y}N$ (where, $0 \leq x \leq 1$; $0 \leq y \leq 1$; $0 \leq x+y \leq 1$) is manufactured. First of all, as shown in FIG. 1A, on a p-GaN contact layer 16 of an n-type semiconductor layer (n-GaN contact layer 11, n-AlGaN clad layer 12 and n-GaN guide layer 13), an active layer (InGaN/GaN active layer 14) and a p-type semiconductor layer (p-AlGaN electronic block layer 24, p-GaN guide layer 25, p-AlGaN clad layer 15, and p-GaN contact layer 16) are sequentially arranged on the substrate 10, two layers of a mask layer (first mask layer 20 and second mask layer 21) are formed in the order of the higher etching rate closer to the p-GaN contact layer 16. The substrate 10 may be, for example, a sapphire substrate or a GaN substrate.

In this way, by forming the two-layer mask layer including first mask layer 20 and second mask layer 21 wherein the first mask layer 20 closer to the p-GaN contact layer 16 has a higher etching rate, it becomes possible to form a groove on the relevant side surface by selectively etching the side surface of the first mask layer 20 with a higher etching rate in the side etching process discussed below.

In this event, it is preferable that the ratio of the etching rate of the first mask layer 20 with a higher etching rate to the second mask layer 21 with a lower etching rate is 5 or more. It is more preferable to set the etching rate ratio to 10 or more. By setting the etching rate ratio to 5 or more, in the side etching process discussed below, the etching rate of the second mask layer 21 with a lower etching rate can be decreased to an extremely small amount and the depth of the groove portion can be adjusted. Consequently, in the $ZrO_2$ film forming process and $Al_2O_3$ film forming process discussed below, sufficient entry rates of the $ZrO_2$ film and the $Al_2O_3$ film can be achieved and the effects of minimizing the concentration of an electric field at the edge portion of the mesa portion on the p-type semiconductor layer can be increased.

In addition, of the two mask layers, the first mask layer 20 with the higher etching rate is made of an oxide or nitride formed by spin-coating, heat-hardening, ultraviolet-curing after spin-coating, or laser ablation; and the second mask layer 21 with the lower etching rate is made of an oxide or nitride formed by sputtering or plasma enhanced chemical vapor deposition. The first mask layer 20 and the second mask layer 21 may include any of the combinations chosen from an $SiO_2$ layer formed by spin-coating, heat-hardening, or ultraviolet-curing after spin-coating, and an $SiO_2$ layer formed by sputtering; an $SiO_2$ layer formed by spin-coating, heat-hardening, or ultraviolet-curing after spin-coating, and an $SiO_2$ layer formed by plasma enhanced chemical vapor deposition; an $SiO_2$ layer formed by spin-coating, heat-hardening, or ultraviolet-curing after spin-coating, and an SiN layer formed by sputtering; an $SiO_2$ layer formed by spin-coating, heat-hardening, or ultraviolet-curing after spin-coating, and an SiN layer formed by plasma enhanced chemical vapor deposition; an $SiO_2$ layer formed by spin-coating, heat-hardening, ultraviolet-curing after spin-coating, and a $ZrO_2$ layer formed by sputtering; a ZnO layer formed by laser ablation, and an $SiO_2$ layer formed by sputtering; a ZnO layer formed by laser ablation, and an $SiO_2$ layer formed by plasma enhanced chemical vapor deposition; a ZnO layer formed by laser ablation, and an SiN layer formed by sputtering; a ZnO layer formed by laser ablation, and an SiN layer formed by plasma enhanced chemical vapor deposition; or a ZnO layer formed by laser ablation, and a $ZrO_2$ layer formed by sputtering.

By choosing any of the foregoing for the combination of the first mask layer 20 and the second mask layer 21, a sufficient difference can be achieved between the etching rates, and the etching rate of the second mask layer 21 with the lower etching rate in the side etching process discussed below can be decreased to an extremely small amount. Consequently, in the side etching process, the depth of the groove portion can be adjusted. Consequently, in the $ZrO_2$ film forming process and $Al_2O_3$ film forming process, sufficient entry rates of the $ZrO_2$ film and the $Al_2O_3$ film can be achieved and a semiconductor light-emitting device having minimal effects of the concentration of an electric field at the edge portion of the mesa portion on the p-type semiconductor layer can be manufactured.

Herein, "spin-coating" means a coating method to disperse a specified solution to the whole substrate by rotating a substrate after the specified solution is applied to the substrate. The $SiO_2$ layer formed by spin-coating is a SOG (Spin On Glass) layer, and as a specified solution, a silanol compound solution is applied, for example. After spin-coating, the layer is formed by letting the substrate stand at room temperature and letting it dry naturally or by heat-treating.

In the present preferred embodiment, as the first mask layer 20, the $SiO_2$ layer may be formed by a sol-gel process and as the second mask layer 21, the $SiO_2$ layer may be formed by sputtering. A "sol-gel process" is a process to obtain an oxide by heating a gel composed of metal alkoxide from which fluidity of the sol is lost by hydrolysis or polycondensation reaction. Because the sol-gel process makes bonding between atoms more disperse as compared to sputtering, a sufficient ratio of etching rates of the first mask layer 20 to the second mask layer 21 can be achieved.

In addition, it is preferable to allow the first mask layer 20 with the higher etching rate to have a layer thickness H1 from about 10 nm to about 500 nm. By making the layer thickness H1 of the mask layer 20 from about 10 nm to about 500 nm, it is possible to angle the inner side wall surface along the edge of the top surface of the mesa portion of the $Al_2O_3$ film, which is an insulation film formed on the mesa portion in the $ZrO_2$ film forming process and $Al_2O_3$ film forming process discussed below, upwards. Consequently, it becomes possible to manufacture a semiconductor light-emitting device with a minimized stress concentration between the $ZrO_2$ film and the $Al_2O_3$ film and the top surface of the mesa portion. In addition, in the event that the second mask layer 21 is formed by sputtering or plasma enhanced chemical vapor deposition as is the case of the present preferred embodiment, it is possible to provide a first mask layer 20 that minimizes plasma damage to the p-GaN contact layer 16.

Mask-Layer Etching Process

Then, on the first mask 20 and the second mask 21 formed by the mask layer forming process, a resist pattern 22 is formed as shown in FIG. 1B. In the present preferred embodiment, in order to mass-produce semiconductor light-emitting devices, striped resist patterns are formed. In addition, the stripe width is from, for example, about 1 μm to about 2 μm. And with the resist pattern 22 used as a mask, as shown in FIG. 1C, both layers of the first mask layer 20 and the second mask layer 21 are etched. Thereafter, resist pattern 22 is peeled from the first mask layer 20 and the second mask layer 21.

Semiconductor Layer Etching Process

Next, using the resist patterns of the first mask layer 20 and the second mask layer 21 of the two layers formed by the mask layer etching process, as shown in FIG. 1D, dry-etching is carried out on p-GaN contact layer 16 and p-AlGaN clad layer 15, as well as partially on the p-GaN guide layer 25. By this process, mesa portion 31 which is electrically connected to the p-type electrode layer, formed later, is formed on the p-GaN contact layer 16. In the event the thickness of the second mask layer 21 is thin, the second mask layer 21 is completely removed during dry etching, and therefore, the thickness of the second mask layer 21 is greater than a specified value in the mask layer forming process.

Side Etching Process

Next, as shown in FIG. 2A, of the two layers of the mask layer, the side surface of the first mask layer 20 is selectively etched to form a groove portion 37 with a portion of the p-GaN contact layer 16 exposed. In this event, in the present preferred embodiment, buffered hydrofluoric acid which is an ammonium hydrogen difluoride solution is used as an etchant, and the mesa portion 31 shown in FIG. 1D is immersed in this etchant for a specified time to carry out wet-etching and the groove portion 37 (FIG. 2A) is formed. The depth L1 of this groove portion 37 is determined in accordance with the entry amount of the insulation film in the $ZrO_2$ film and $Al_2O_3$ film forming process, discussed below. It is noted that in the event that a ZnO layer formed by laser ablation is applied as the first mask layer 20, hydrochloric acid is applied as the etchant to form the groove portion 37.

$ZrO_2$ Film and $Al_2O_3$ Film Forming Process

Then, as shown in FIG. 2B, $ZrO_2$ film 26 is formed to cover the p-GaN contact layer 16 with the groove portion 37 exposed ($ZrO_2$ film forming process). Thereafter, the $Al_2O_3$ film 27 is formed to cover the $ZrO_2$ film 26 ($Al_2O_3$ film forming process). In the present preferred embodiment, the $ZrO_2$ film 26 and $Al_2O_3$ film 27 are formed by sputtering, plasma enhanced chemical vapor deposition, or laser ablation, which are previously discussed. Since using these methods causes the surface 23 on the upper side of the groove portion 37 to shield against the material $ZrO_2$ film 26 and $Al_2O_3$ film 27 which are insulation films deposited from above, the $ZrO_2$ film 26 and $Al_2O_3$ film 27 enter the groove portion 37 as shown in FIG. 2B. Consequently, it becomes possible to make a gap in the $ZrO_2$ film 26 and the $Al_2O_3$ film 27 so as to prevent the $ZrO_2$ film 26 and $Al_2O_3$ film 27 from covering the whole surface of the first and second layers 20, 21. That is, a cut line is provided between the $ZrO_2$ film 26 and $Al_2O_3$ film 27 that cover the exposed p-GaN contact layer 16 of the groove portion 37 and the $ZrO_2$ film 26 and $Al_2O_3$ film 27 that cover the second mask layer 21. Consequently, in the event that the first mask layer 20 and the second mask layer 21 are removed from the p-GaN contact layer 16 in the mask layer removal process, discussed below, it becomes possible to lift off the first mask layer 20 and the second mask layer 21 at the cut line. Consequently, it is possible to increase the lift-off yield from the p-GaN contact layer 16.

In addition, by allowing the insulation film $ZrO_2$ film 26 and $Al_2O_3$ film 27 into the groove portion 37, the edge portion 32 of the mesa portion 31 formed in the previously discussed semiconductor layer etching process is covered with the $ZrO_2$ film 26 and $Al_2O_3$ film 27 to minimize an electric field concentration at the edge portion 32, and it becomes possible to manufacture a semiconductor light-emitting device with an improved voltage resistance. Furthermore, by forming a two-layer insulation film with the $ZrO_2$ film 26 as the lower layer and the $Al_2O_3$ film 27 as the upper layer by the $ZrO_2$ film forming process and the $Al_2O_3$ film forming process, adhesion between the p-type electrode layer, discussed below, and the insulation film is improved by the upper layer $Al_2O_3$ film 27, and by achieving consistency between the refraction index (refraction index: 2.2) of the $ZrO_2$ film 26 and the refraction index (refraction index: 2.5) of the p-type semiconductor layer 16 by the lower-layer $ZrO_2$ film 26, locked-in effects of light can be alleviated. As a result, a semiconductor light-emitting device having a stabilized kink level can be manufactured. In addition, it becomes possible to control the kink level by designing the width of the mesa portion 31 alone.

It is preferable to form the $ZrO_2$ film 26 having a thickness from about 10 nm to about 400 nm and the $Al_2O_3$ film 27 having a thickness from about 10 nm to about 100 nm. By forming the $ZrO_2$ film 26 and $Al_2O_3$ film 27 having a total film thickness of not less than 500 nm causes the insulation film to cover the groove portion 37 and it is not possible to provide a cut line between the insulation films.

It is noted that in the event that only the edge portion 32 is covered with $ZrO_2$ film 26 and $Al_2O_3$ film 27, it is assumed that, for example, the side surface of the $SiO_2$ film is etched in advance, in the conventional manufacturing method. The present preferred embodiment achieves remarkable effects as compared to the conventional technique in that the present preferred embodiment can simultaneously satisfy the requirements of covering the edge portion 32 with the $ZrO_2$ film 26 and the $Al_2O_3$ film 27 and of improving the liftoff yield from the p-GaN contact layer 16 which is the p-type semiconductor layer.

Mask Layer Removal Process

Then, the remaining first mask layer 20 and the second mask layer 21 are removed from the p-GaN contact layer 16 as shown in FIG. 2C. In the present preferred embodiment, the mesa portion 31 shown in FIG. 2B is immersed in the above-mentioned buffered hydrofluoric acid and the first mask layer 20 and the second mask layer 21 are removed.

Electrode Layer Forming Process

Next, the p-type electrode layer 18 is formed such that the p-type electrode layer 18 covers the entire surface of the top surface 30 of the p-GaN contact layer 16 exposed by the mask layer removal process, as shown in FIG. 2D. In this event, the p-type electrode layer 18 is formed by vapor-depositing only on the top surface 30 and the side surface of the mesa portion 31. In addition, both the $ZrO_2$ film 26 and $Al_2O_3$ film 27 are removed by dry etching to expose the n-GaN contact layer 11. And on the top surface of the n-GaN contact layer 11 exposed by the liftoff, an n-type electrode layer 19 is formed. A portion of the n-GaN contact layer 11 is partially removed and exposed, and on the exposed top surface of the n-GaN contact layer 11, the n-type electrode layer 19 is formed. Thereafter, the substrate 10 and all of the layers are cleaved to produce a semiconductor light-emitting device. The above cleavage can be achieved by thinning the substrate 10 by lapping in advance.

It is noted that in the present preferred embodiment, the location space for the n-type electrode layer 19 is formed in the electrode layer forming process, but the location space of the n-type electrode layer 19 may be formed by partially removing the n-GaN contact layer 11 so as to be exposed by dry etching in FIG. 2A, before or after the side etching process.

Now, description will be made of the semiconductor light-emitting device according to another preferred embodiment. The semiconductor light-emitting device according to the present preferred embodiment can be manufactured by the above-mentioned manufacturing method, or by other manufacturing methods.

Figure 3B:
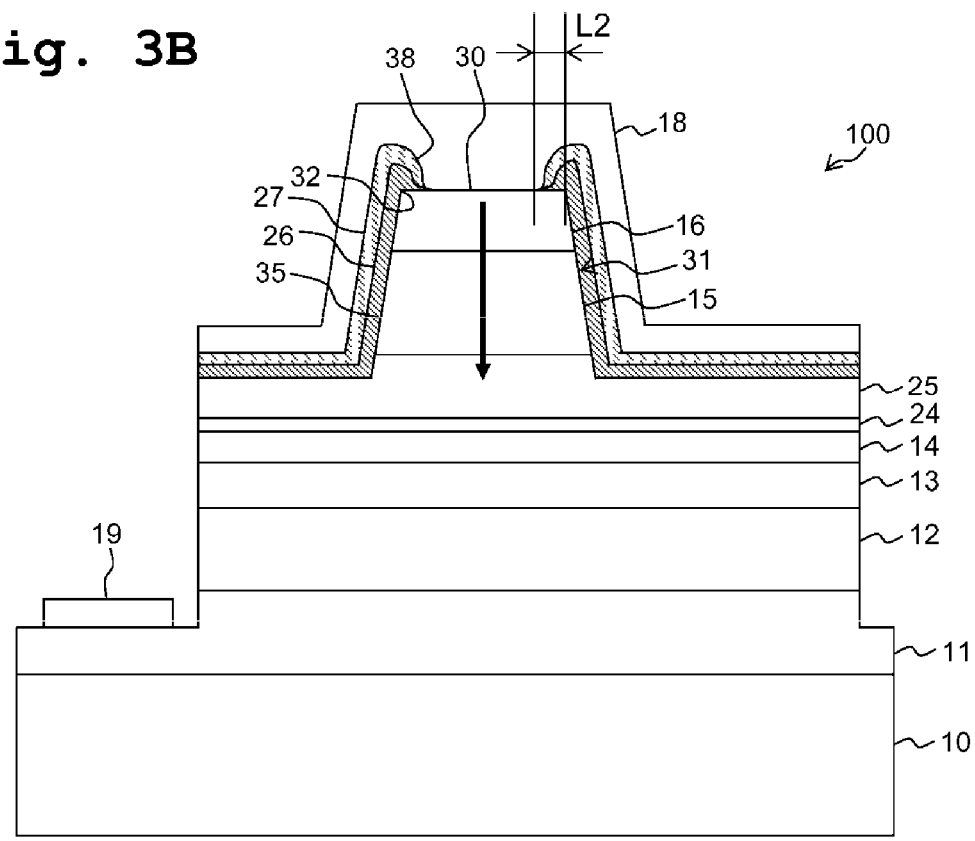
Figure 4A:
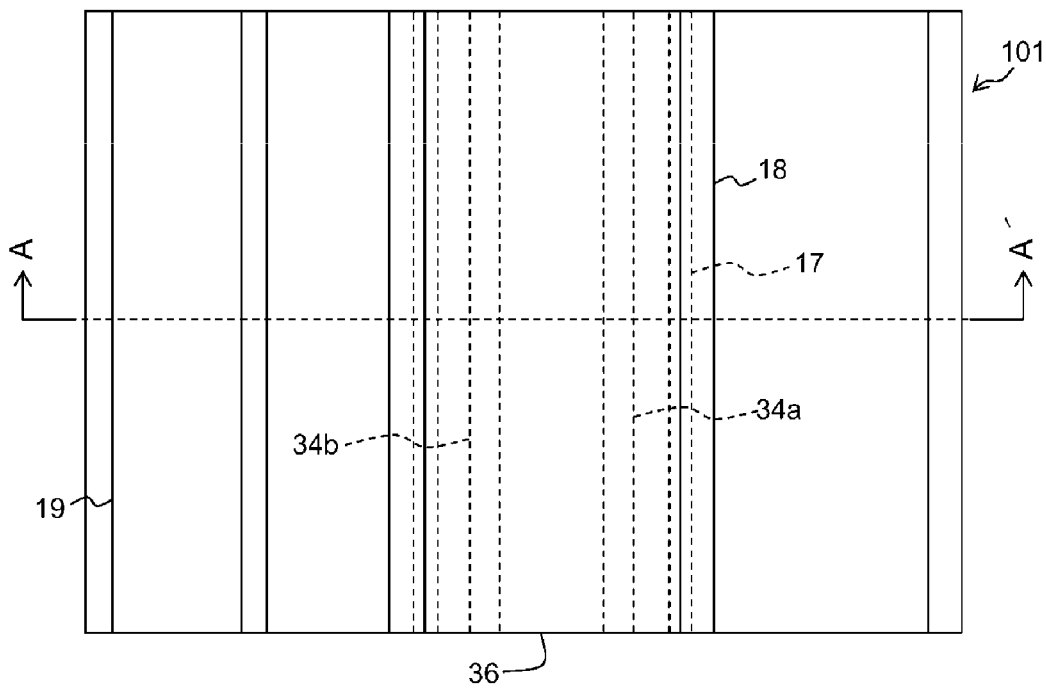
FIGS. 4A and 4B are schematic block diagrams of a semiconductor light-emitting device according to another preferred embodiment of the present invention.
Figure 4B:
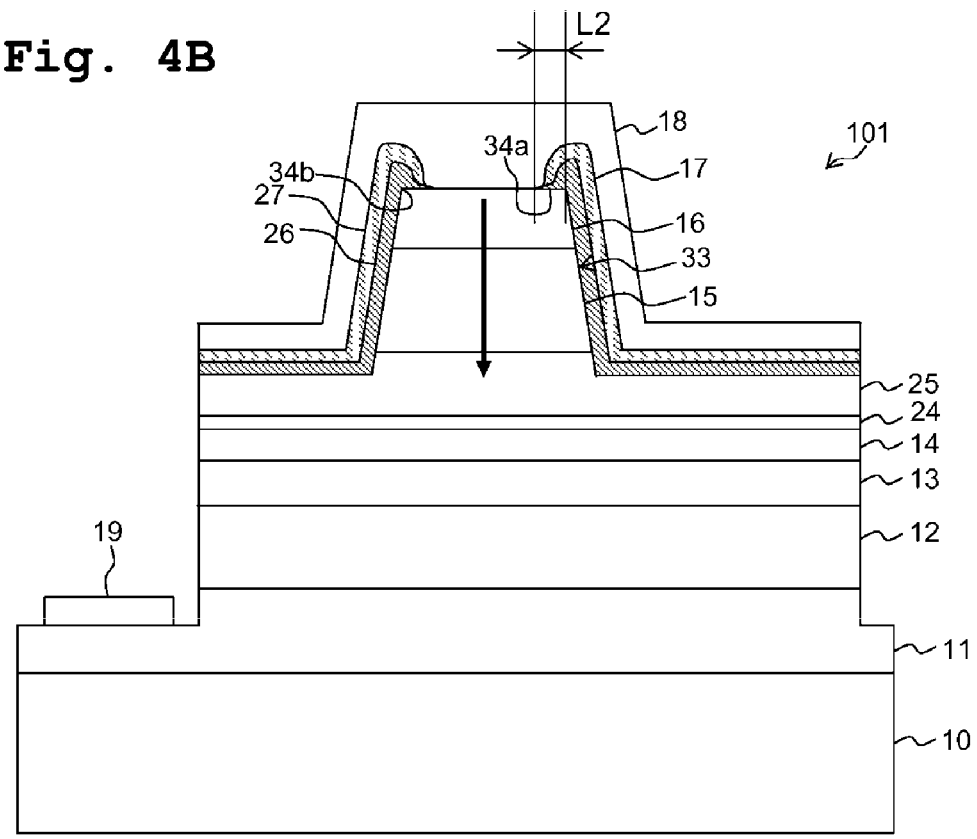

FIGS. 3A and 3B show schematic block diagrams of a semiconductor light-emitting device according to the present preferred embodiment. In addition, FIGS. 4A and 4B show schematic block diagrams of a semiconductor light-emitting device of another method.

A semiconductor light-emitting device 100 according to the present preferred embodiment is a semiconductor light-emitting device composed of a Group-III nitride-based compound semiconductor expressed by $Al_xGa_yIn_{1-x-y}N$ (where, $0 \leq x \leq 1; 0 \leq y \leq 1; 0 \leq x+y \leq 1$) and has a substrate 10; n-GaN contact layer 11, n-AlGaN clad layer 12, and n-GaN guide layer 13 as n-type semiconductor layers arranged on the substrate 10; InGaN/GaN active layer 14 as an active layer arranged on the n-GaN guide layer 13; p-AlGaN electronic block layer 24, p-GaN guide layer 25, p-AlGaN clad layer 15, and p-GaN contact layer 16 as p-type semiconductor layers with the mesa portion 31 protruding above the InGaN/GaN active layer 14; $ZrO_2$ film 26 that covers the mesa portion 31 from the inner side along the edge 32 of the top surface 30 to the side surface 35 of the mesa portion 31 so as to expose the top surface 30 of the mesa portion 31; $Al_2O_3$ film 27 that covers the $ZrO_2$ film 26 so as to expose the top surface 30 of the mesa portion 31; p-type electrode layer 18 as an electrode layer that covers the mesa portion 31 from above the $ZrO_2$ film 26 and the $Al_2O_3$ film 27 and electrically connects to the p-type semiconductor layer 16; and n-type electrode layer 19 which electrically connects to the n-GaN contact layer 11.

By covering the mesa portion 31 with the $ZrO_2$ film 26 and the $Al_2O_3$ film 27 from the inner side along the edge 32 of the top surface 30 to the side surface 35 of the mesa portion 31 so as to expose the top surface 30 of the mesa portion 31, the center portion of the top surface 30 of the mesa portion 31 serves as a contact portion between the p-type electrode layer 18 and the p-GaN contact layer 16. Consequently, it becomes possible to conduct the current from the p-type electrode layer 18 from the center of the top surface 30 of the mesa portion 31 toward the p-GaN contact layer 16 as shown by the arrow in FIG. 3B. Consequently, it is possible to minimize an electric field concentration at the edge portion 32 of the mesa portion 31 by the current from the p-type electrode layer 18 and the voltage resistance is improved. Consequently, the semiconductor light-emitting device 100 according to the present preferred embodiment provides a high output. Furthermore, by forming an insulation film of two layers defined by the lower layer with the $ZrO_2$ film 26 and the upper layer with the $Al_2O_3$ film 27, adhesion between the p-type electrode layer 18 and the insulation layer can be improved by the upper-layer $Al_2O_3$ film 27, and by achieving consistency between the refraction index of the $ZrO_2$ film 26 (refraction index: 2.2) and the refraction index of p-GaN contact layer 16 (refraction index: 2.5), which is the p-type semiconductor layer, by the lower-layer $ZrO_2$ film 26, locked-in effects of light can be alleviated. As a result, the kink level of a semiconductor light-emitting device 100 can be stabilized.

In the present preferred embodiment, as shown in FIG. 3A, an insulation film 17 is arranged so as to cover the periphery of the top surface 30 of the mesa portion 31 along the edge portion 32 of the mesa portion 31, and the top surface 30 of the mesa portion 31 is exposed in the form of a cavity. The arrangement of the $ZrO_2$ film 26 and the $Al_2O_3$ film 27 is varied in accordance with the shape of the resist pattern 22 (FIG. 1B) in the mask layer etching process. However, such an arrangement that the periphery of the top surface 30 of the mesa portion 31 is covered with the $ZrO_2$ film 26 and the $Al_2O_3$ film 27, as shown in FIG. 3A, minimizes the effects of an electric field concentration. In addition, the $ZrO_2$ film 26 and the $Al_2O_3$ film 27 may be arranged in parallel to each other along both edge portions 34a and 34b of the mesa portion 33 as is the case of a semiconductor light-emitting device 101 according to another preferred embodiment shown in FIG. 4A. In Group-III nitride-based compound semiconductors, semiconductor layers are frequently formed on sapphire substrates 10. In such a case, since the n-type electrode layer 19 and the p-type electrode layer 18 are arranged in the same direction, at the edge portion 36 on the side parallel to the arrangement of the p-type electrode 18 and the n-type electrode layer 19 of the mesa portion 33, electric field concentration caused by the current that flows from the p-type electrode layer is unlikely to occur. Consequently, covering the edge portions 34a and 34b of the $ZrO_2$ film 26 and the $Al_2O_3$ film 27 on the side perpendicular to the arrangement of the p-type electrode layer 18 and n-type electrode layer 19 can sufficiently minimize the electric field concentration. In such event, in the mask layer etching process, it is only necessary to form the resist pattern 22 (FIG. 1B) into stripes.

Figure 5:
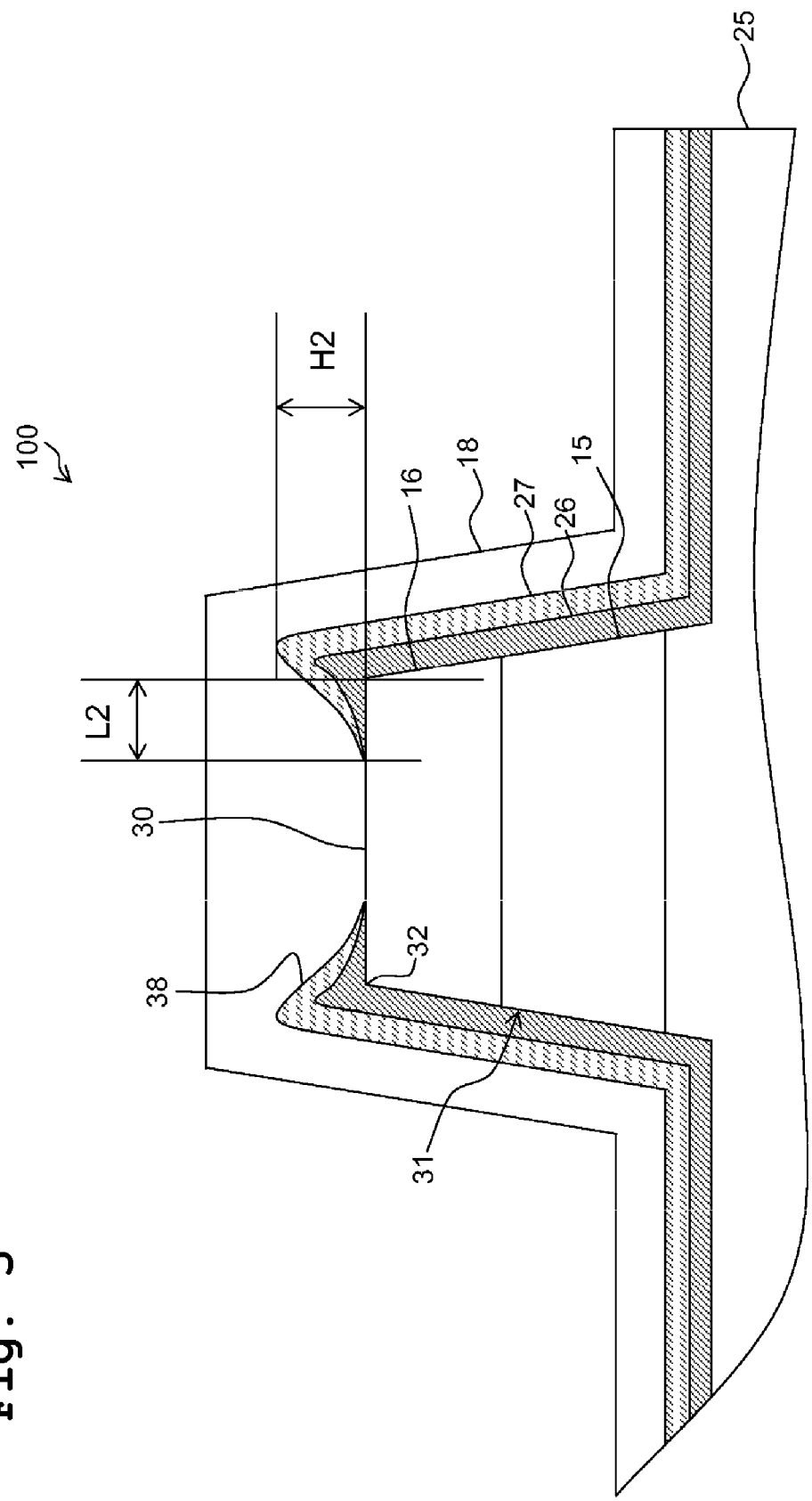
FIG. 5 is an enlarged schematic sectional view of the mesa portion of the semiconductor light-emitting device according to another preferred embodiment of the present invention.
Figure 6:
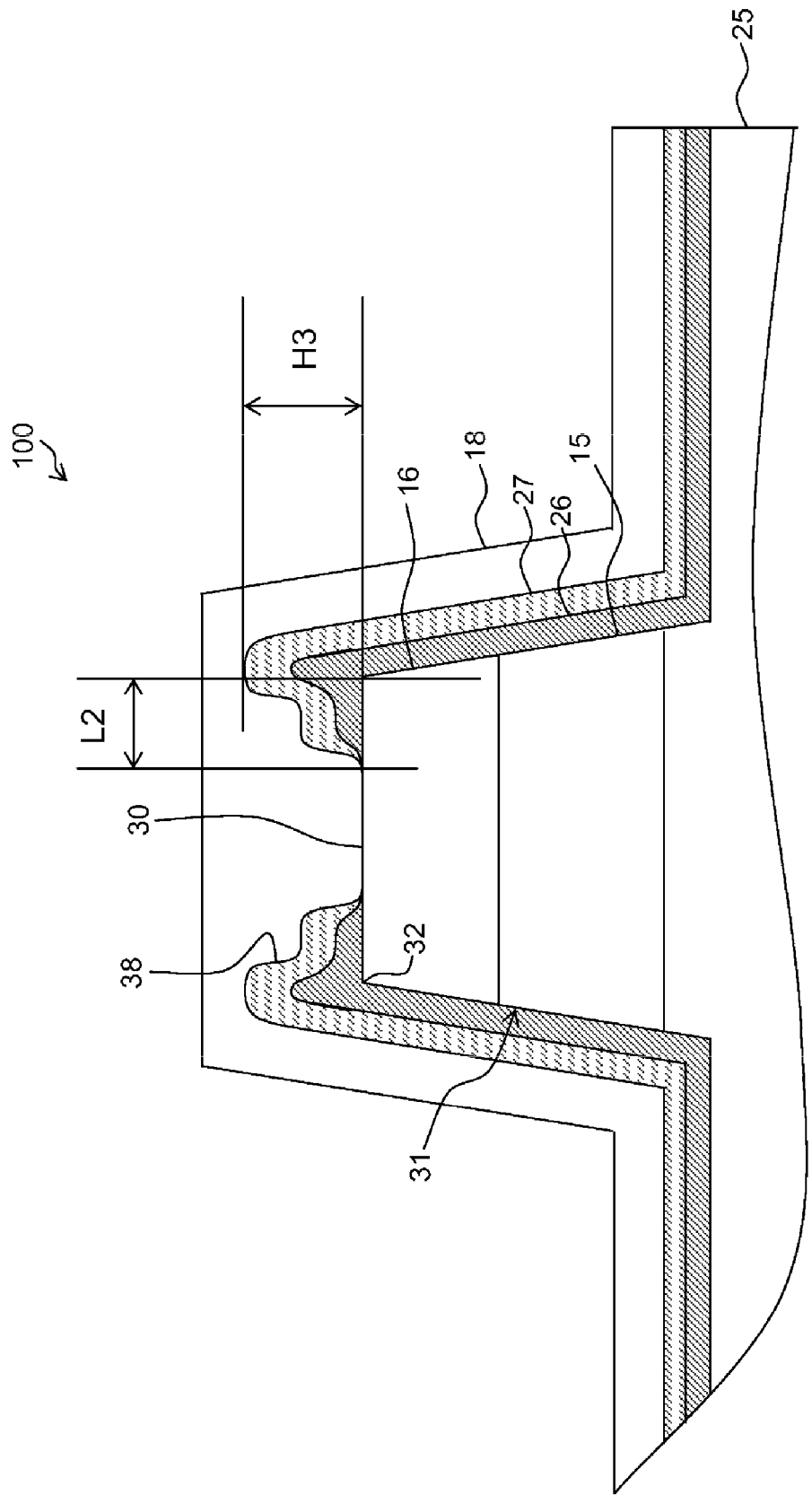
FIG. 6 is an enlarged schematic sectional view of the mesa portion of the semiconductor light-emitting device according to another preferred embodiment of the present invention.
Figure 7:
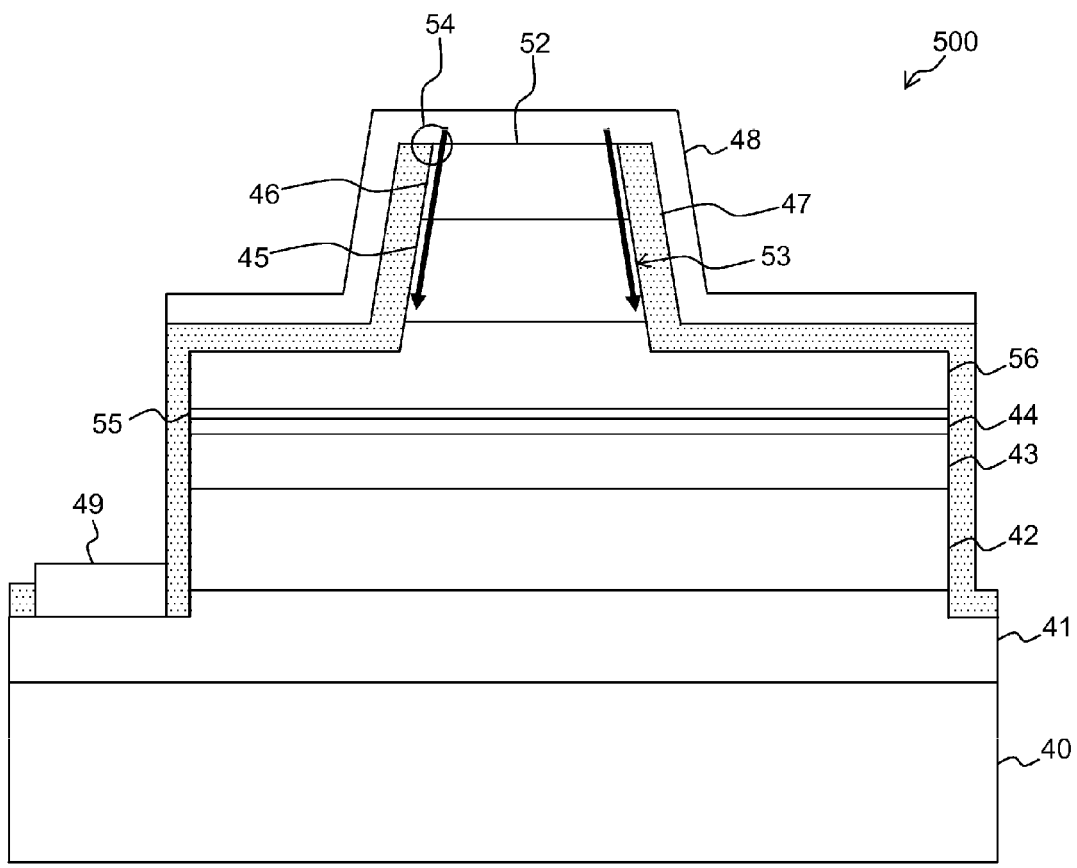
FIG. 7 is a schematic block diagram of a semiconductor light-emitting device obtained by a conventional manufacturing method.

Now, the shape of the inner wall surface 38 along the top surface 30 of the mesa portion 31 of the $ZrO_2$ film 26 and the $Al_2O_3$ film 27 will be described in detail. In FIG. 5 and FIG. 6, enlarged schematic sectional views of the mesa portion of the semiconductor light-emitting device according to the present preferred embodiment are shown.

It is desirable that the inner wall surface 38 along the top surface 30 of the mesa portion 31 of the $ZrO_2$ film 26 and the $Al_2O_3$ film 27 is angled so as to extend towards the top of the mesa portion 31 as shown in FIG. 5. By allowing the wall surface 38 to angle so as to extend towards the top of the mesa portion 31, a smooth curve can be drawn from the top surface 30 of the mesa portion 31 to the wall surface 38 and no stress concentration occurs, which is caused by the difference in the thermal expansion rate between the $ZrO_2$ film 26 and the $Al_2O_3$ film 27 and the top surface 30 of the mesa portion 31. Consequently, the semiconductor light-emitting device 100 can achieve a longer life.

Furthermore, it is preferable that the wall surface 38 should have a ratio of 3 or less of the width L2 from the edge portion 32 of the $ZrO_2$ film 26 and the $Al_2O_3$ film 27 to the height H2 of the $ZrO_2$ film 26 and the $Al_2O_3$ film 27 (that is, the value of H2/L2) in order to minimize stress concentration. A specified gradient angle of the wall surface 38 can be obtained by adjusting the layer thickness H1 of the first mask layer 20 formed in the mask layer forming process (FIG. 1A and FIG. 2A) and the depth L1 of the groove portion 37 formed in the side etching process (FIG. 2A). It is noted that the layer thickness H1 (FIG. 1A and FIG. 2A) of the first mask layer 20 in the mask layer forming process should be from about 10 nm to about 500 nm. In addition, the depth L1 (FIG. 2A) of the groove portion 37 in the side etching process is determined by adjusting the etching time so that the ratio of the layer thickness H1 of the first mask layer 20 to the depth L1 of the groove portion 37 is 3 or less to match with the layer thickness H1 of the first mask layer 20. In such a case, a groove portion 37 of 0.2 μm deep can be formed from a layer thickness of the first mask layer from about 20 nm to about 100 nm and a layer thickness of the second mask layer 21 of about 200 nm, and carrying out wet-etching by immersing the mesa portion 31 for 60 seconds in a buffered hydrofluoric acid of 10% concentration, which is an etchant.

In addition, the wall surface 38 is preferably formed in a two-step tiered structure as is the case of another preferred embodiment shown in FIG. 6. By forming the wall surface 38 in a two-step tiered structure, the thickness H3 of the $ZrO_2$ film 26 and the $Al_2O_3$ film 27 between the edge portion 32 of the mesa portion 31 and the p-type electrode layer 18 can be increased. Consequently, sufficient insulation can be obtained between the p-type electrode layer 18 and the edge portion of the mesa portion 31 by the $ZrO_2$ film 26 and the $Al_2O_3$ film 27, and an electric field concentration of the mesa portion 31 at the edge portion 32 can be minimized. A specified wall surface 38 of the two-step tiered structure can be obtained by adjusting the wall surface 38 by the layer thickness H1 (FIG. 1A and FIG. 2A) of the first mask layer formed in the mask layer forming process and the depth L1 (FIG. 2A) of the groove portion formed in the side etching process. It is noted that in the event that the wall surface 38 in a two-step tiered structure is obtained, the layer thickness H1 (FIG. 1A and FIG. 2A) of the first mask layer 20 in the mask layer forming process is preferably greater than, for example, about 100 nm.

Furthermore, it is preferable that the $ZrO_2$ film 26 and the $Al_2O_3$ film 27 have a width L2 (FIG. 3 through FIG. 6) from about 0 to about 0.5 μm from the edge portion 32 of the contact portion between the $ZrO_2$ film 26 and the $Al_2O_3$ film 27 and the top surface 30 of the mesa portion 31. By obtaining the width from the edge portion 32 of the $ZrO_2$ film 26 and the $Al_2O_3$ film 27 from about 0 to about 0.5 μm, it is possible to increase the effects of minimizing the electric field concentration at the edge portion 32 of the mesa portion 31 on the p-GaN contact layer 16 while a sufficient amount of current from the p-type electrode layer 18 to the p-GaN contact layer 16 is maintained.

With the foregoing description, because it becomes possible to provide a cut line in the $ZrO_2$ film 26 and $Al_2O_3$ film 27 by forming a groove portion and forming the $ZrO_2$ film 26 and $Al_2O_3$ film 27 so as to enter the groove portion in the manufacturing method of the semiconductor light-emitting device 100 according to the present preferred embodiment, it is possible to increase the liftoff yield of the p-GaN contact layer 16. In addition, it is possible to manufacture the semiconductor light-emitting device with the edge portion 32 of the mesa portion 31 on the p-GaN contact layer 16 with the insulation film 17. Furthermore, depending on the layer thickness H1 (FIG. 1A) of the first mask layer 20 in the mask layer forming process, the inner wall surface 38 along the top surface 30 of the mesa portion 31 of the insulation film 17 may be angled to extend towards the top of the mesa portion 31.

On the other hand, the semiconductor light-emitting device 100 with the edge portion 32 of the mesa portion 31 on the p-GaN contact layer 16 covered with the $ZrO_2$ film 26 and $Al_2O_3$ film 27 has improved voltage resistance because the electric field concentration by the current from the p-type electrode layer 18 at the edge portion 32 of the mesa portion 31 is minimized. Consequently, high output can be achieved. Furthermore, angling the inner wall surface 38 along the top surface 30 of the mesa portion 31 of the $ZrO_2$ film 26 and $Al_2O_3$ film 27 so as to extend towards the top of the mesa portion 31 prevents stress concentration from occurring because of a difference of thermal expansion ratios between the $ZrO_2$ film 26 and $Al_2O_3$ film 27 and the top surface 30 of the mesa portion 31, thus providing long life to the semiconductor light-emitting device 100.

Second Preferred Embodiment

Next, discussion will be made of another preferred embodiment of the method of manufacturing a semiconductor light-emitting device. FIG. 8A through FIG. 11D are schematic representations showing processes to form a p-type electrode layer and an n-type electrode layer on a wafer of a Group-III nitride-based compound semiconductor expressed as $Al_xGa_yIn_{1-x-y}N$ (where, $0 \leq x \leq 1$; $0 \leq y \leq 1$; $0 \leq x+y \leq 1$), and to complete a semiconductor light-emitting device. In addition, FIGS. 12A and 12B are schematic representations of a manufacturing process of a semiconductor light-emitting device according to another preferred embodiment. FIG. 8A through FIG. 11D show schematic sectional views of the semiconductor light-emitting device in each process. In addition, in FIGS. 12A through 12B show schematic sectional views of the semiconductor light-emitting device in each process. It is noted that in FIG. 8A through FIG. 12B, only a single-unit semiconductor light-emitting device is described, but this can be extended and applied to the method for manufacturing a plurality of semiconductor light-emitting devices, as is the case of the first preferred embodiment.

Wafer Forming Process

In the method for manufacturing a semiconductor light-emitting device according to the present preferred embodiment, a semiconductor light-emitting device of Group-III nitride-based compound semiconductor expressed as $Al_xGa_yIn_{1-x-y}N$ (where, $0 \leq x \leq 1$; $0 \leq y \leq 1$; $0 \leq x+y \leq 1$) is manufactured. First of all, as shown in FIG. 8A, a wafer 200 is obtained by forming n-type semiconductor layers (n-GaN buffer layer 61, n-AlGaN clad layer 62, and n-GaN guide layer 63); active layers (InGaN superlattice layer 64 and InGaN multiquantum well light-emitting layer 65); and p-type semiconductor layers (p-AlGaN electronic block layer 66, p-GaN guide layer 67, p-AlGaN clad layer 68, and p-GaN contact layer 69) arranged sequentially on a GaN substrate 60.

Figure 8A:
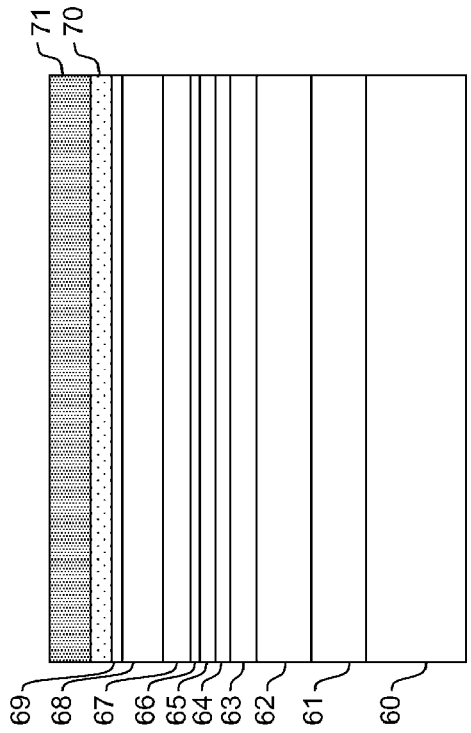
FIGS. 8A to 8D are schematic representations that show a portion of the process to obtain a semiconductor light-emitting device by the method for manufacturing a semiconductor light-emitting device according to a second preferred embodiment of the present invention.

Conduction type, compositional formula, composition ratio, and layer thickness of each layer of wafer 200 of the Group-III nitride-based compound semiconductor shown in FIG. 8A are described below. It is noted that the following explanation is only one example of the configuration of wafer 200.

In the present preferred embodiment, n-GaN buffer layer 61 and n-GaN guide layer 63 are layers expressed by the compositional formula GaN and the relevant layer thicknesses are, for example, about 4000 nm and about 100 nm, respectively. In addition, the n-AlGaN clad layer 62 is, for example, about 1200 nm thick and expressed by the compositional formula $Al_xGa_{1-x}N$ (x: 8%).

In addition, the InGaN superlattice layer 64 which is a portion of the active layer is made into an n-type ½ nm thick layer, for example, and expressed by the compositional formula $In_xGa_{1-x}N$/GaN (x: 2/0%). Furthermore, the InGaN multiquantum well light-emitting layer 65 is formed by alternately laying an n-type 9 nm thick layer, for example, and expressed by the compositional formula GaN over an intrinsic 3 nm thick layer, for example, and expressed by the compositional formula $In_xGa_{1-x}N$ (x: 7%), respectively, from the GaN substrate 60 side. The total of each of the layers is preferably four layers and three layers, respectively.

In addition, the p-AlGaN electronic block layer 66 is formed by laying a 10 nm thick layer, for example, and expressed by the compositional formula $Al_xGa_{1-x}N$ (x: 23%) over a p-type 15 nm thick layer, for example, and expressed by the compositional formula $Al_xGa_{1-x}N$ (x: 23%), respectively.

In addition, the p-GaN guide layer 67 is formed into a 100 nm thick layer, for example, and expressed by the compositional formula GaN. It is noted that this layer may be intrinsic.

Furthermore, the p-AlGaN clad layer 68 is formed into a 400 nm thick layer, for example, and expressed by the compositional formula $Al_xGa_{1-x}N$ (x: 8%) and the p-GaN contact layer 69 is formed into a 100 nm thick layer, for example, and expressed by the compositional formula GaN.

Mask Layer Forming Process

Figure 8B:
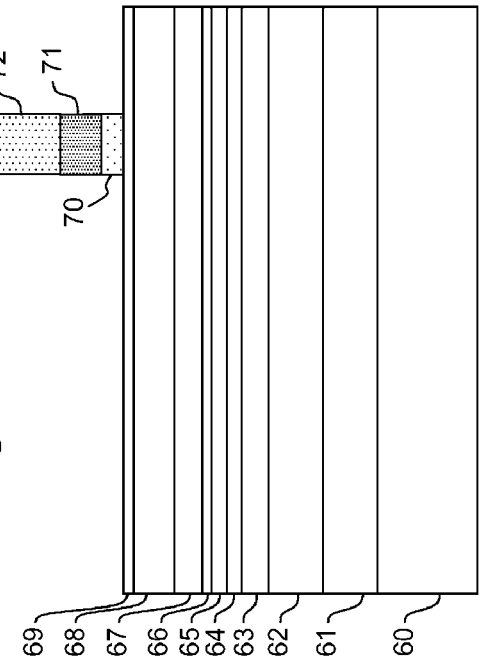

Next, on a wafer 200 shown in FIG. 8A, two layers of a mask layer (first mask layer 70 and second mask layer 71) are formed in the order of higher etching rate from the side closer to the p-GaN contact layer 69 as shown in FIG. 8B.

In this way, by forming a first mask layer 70 and a second mask layer 71 wherein the first mask layer 70 closer to the p-GaN contact layer 69 has a higher etching rate, the side surface of the first mask layer 70 with the higher etching rate is selectively etched in the side etching process, discussed below, and a groove portion can be formed on the relevant side surface.

In such event, as described in the first preferred embodiment, the ratio of the etching rate of the first mask layer 70 with the higher etching rate to the etching rating rate of the second mask layer 71 with the lower etching rate is preferably 5 or more. It is more preferable that the ratio of the etching rates is 10 or more.

In addition, as described in the first preferred embodiment, the first mask layer 70 and the second mask layer 71 may be of any of the combinations chosen from an $SiO_2$ layer formed by spin-coating, heat-hardening, or ultraviolet-curing after spin-coating, and an $SiO_2$ layer formed by sputtering; an $SiO_2$ layer formed by spin-coating, heat-hardening, or ultraviolet-curing after spin-coating, and an $SiO_2$ layer formed by plasma enhanced chemical vapor deposition; an $SiO_2$ layer formed by spin-coating, heat-hardening, or ultraviolet-curing after spin-coating, and an SiN layer formed by sputtering; an $SiO_2$ layer formed by spin-coating, heat-hardening, or ultraviolet-curing after spin-coating, and an SiN layer formed by plasma enhanced chemical vapor deposition; an $SiO_2$ layer formed by spin-coating, heat-hardening, or ultraviolet-curing after spin-coating, and a $ZrO_2$ layer formed by sputtering; a ZnO layer formed by laser ablation, and an $SiO_2$ layer formed by sputtering; a ZnO layer formed by laser ablation, and an $SiO_2$ layer formed by plasma enhanced chemical vapor deposition; a ZnO layer formed by laser ablation, and an SiN layer formed by sputtering; a ZnO layer formed by laser ablation, and an SiN layer formed by plasma enhanced chemical vapor deposition; or a ZnO layer formed by laser ablation, and a $ZrO_2$ layer formed by sputtering.

In addition, as described with respect to the first mask layer 70 with the higher etching rate, it is preferable to have the layer thickness be from about 10 nm to about 500 nm.

Mask-Layer Etching Process

Figure 8C:
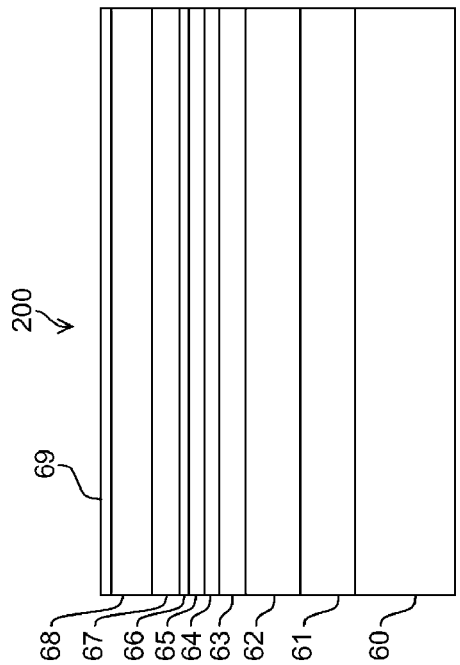
Figure 8D:
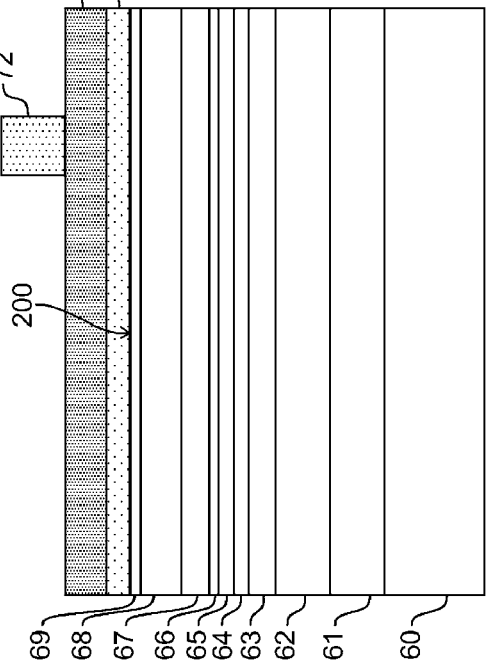

Then, on the first mask 70 and the second mask 71 formed by the mask layer forming process, a specified resist pattern 72 is formed as shown in FIG. 8C. And with the resist pattern 72 used as a mask, as shown in FIG. 8D, both layers of the first mask layer 70 and the second mask layer 71 are etched. Thereafter, resist pattern 72 is peeled from the first mask layer 70 and the second mask layer 71 of the two layers (FIG. 9A).

Semiconductor Layer Etching Process

Next, using resist patterns of the first mask layer 70 and the second mask layer 71 of the two layers formed by the mask layer etching process, as shown in FIG. 9B, dry-etching is carried out on p-GaN contact layer 69 and p-AlGaN clad layer 68, as well as partially on the p-GaN guide layer 67. In the event that the layer thickness of the second mask layer 71 is thin, the second mask layer 71 is completely removed during dry etching, and therefore, the layer thickness of the second mask layer 71 is greater than a specified value in the mask layer forming process. By this process, a mesa portion 80 to be electrically connected to the p-type electrode layer formed later is formed on the p-GaN contact layer 69.

Side Etching Process

Next, as shown in FIG. 9C, of the two layers of the mask layer, the side surface of the first mask layer 70 is selectively etched to form a groove portion 81 with part of the p-GaN contact layer 69 exposed. In this event, in the present preferred embodiment, buffered hydrofluoric acid is used as an etchant, and the mesa portion 80 shown in FIG. 8C is immersed in this etchant for a specified time to carry out wet-etching to form the groove portion 81. The depth of the groove portion 81 is determined in accordance with the entry amount of the insulation film formed in the insulation film forming process discussed below.

$ZrO_2$ Film and $Al_2O_3$ Film Forming Process

Then, $ZrO_2$ film 83 is formed to cover the exposed p-GaN contact layer 69 of the groove portion 81 formed by the side etching process (FIG. 9D). Thereafter, the $Al_2O_3$ film 84 is formed to cover the $ZrO_2$ film 83 (FIG. 9D). In the present preferred embodiment, the $ZrO_2$ film 83 and $Al_2O_3$ film 84 are formed by sputtering, plasma enhanced chemical vapor deposition, or laser ablation, which are previously discussed. By these processes, as shown in FIG. 9D, the $ZrO_2$ film 83 and $Al_2O_3$ film 84 are formed to enter the groove portion 81 as shown in FIG. 9C. Consequently, it becomes possible to make a gap between the insulation films so as to prevent the insulation films $ZrO_2$ film 83 and $Al_2O_3$ film 84 from covering the entire surface of the first mask layer 70 and the second mask layer 71. That is, a cut line is provided between the $ZrO_2$ film 83 and $Al_2O_3$ film 84 that cover the exposed p-GaN contact layer 69 of the groove portion 81 and the $ZrO_2$ film 83 and $Al_2O_3$ film 84 that cover the second mask layer 71. Consequently, in the event that the first mask layer 70 and the second mask layer 71 are removed from the p-GaN contact layer 69 in the mask layer removal process discussed below, it becomes possible to lift off the first mask layer 70 and the second mask layer 71 at the cut line. Consequently, it is possible to increase the liftoff yield of the p-GaN contact layer 69. In addition, by allowing the ZrO$_2$ film 83 and Al$_2$O$_3$ film 84 into the groove portion 81, the edge portion 82 of the mesa portion 80 formed in the previously discussed semiconductor layer etching process is covered with the ZrO$_2$ film 83 and Al$_2$O$_3$ film 84 to minimize an electric field concentration at the edge portion 82, and it becomes possible to manufacture a semiconductor light-emitting device with an improved voltage resistance. Furthermore, by forming the two-layer insulation film with the ZrO$_2$ film 83 as the lower layer and the Al$_2$O$_3$ film 84 as the upper layer by the ZrO$_2$ film forming process and the Al$_2$O$_3$ film forming process, adhesion between the p-type electrode layer discussed below and the insulation film is improved by the upper layer Al$_2$O$_3$ film 84, and by achieving consistency between the refraction index (refraction index: 2.2) of the ZrO$_2$ film 83 and the refraction index (refraction index: 2.5) of the p-type semiconductor layer 69 by the lower-layer ZrO$_2$ film 83, locked-in effects of light can be alleviated. As a result, a semiconductor light-emitting device having a stabilized kink level can be manufactured.

It is desirable to form the ZrO$_2$ film 83 to have a thickness from about 10 nm to about 400 nm and the Al$_2$O$_3$ film 84 to have a thickness from about 10 nm to about 100 nm. By forming the ZrO$_2$ film 83 and Al$_2$O$_3$ film 84 having a total film thickness not less than 500 nm causes the insulation film to cover the groove portion 37 and it is unable to provide a cut line between the insulation films.

Mask Layer Removal Process

Then, as described in the first preferred embodiment, by immersing the mesa portion 80 shown in FIG. 9D in, for example, a buffered hydrofluoric acid, the remaining first mask layer 70 and the second mask layer 71 are lifted off from the p-GaN contact layer 69.

Electrode Layer Forming Process

Next, the p-type electrode layer 74 is formed such that the p-type electrode layer 74 covers the entire surface of the p-GaN contact layer 69 exposed by the mask layer removal process, as shown in FIG. 12A.

Next, as shown in FIG. 10B, the photoresist 75 is formed such that it covers the p-type electrode layer 74 on the mesa portion 80, and with the photoresist 75 used as a mask, the semiconductor layer is dry-etched down to the n-GaN buffer layer 61 together with p-type electrode layer 74 and ZrO$_2$ film 83 and Al$_2$O$_3$ film 84. Then, the photoresist 75 is peeled from the p-type electrode layer 74 (FIG. 10D).

Figure 11A:
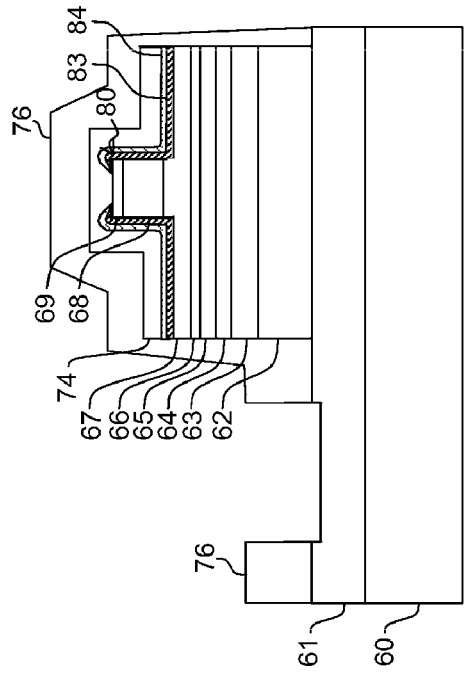
FIGS. 11A to 11D are schematic representations that show a portion of the process to obtain a semiconductor light-emitting device by the method for manufacturing a semiconductor light-emitting device according to the second preferred embodiment of the present invention.
Figure 11B:
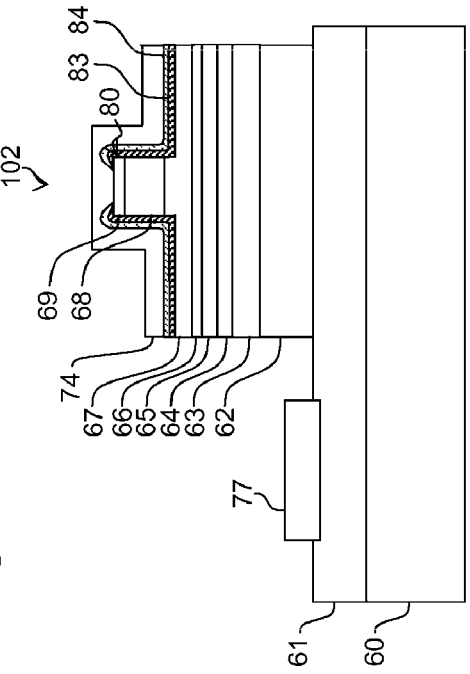
Figure 11C:
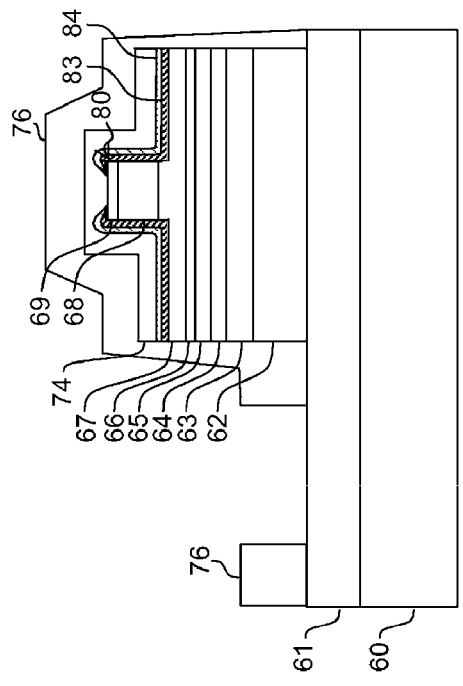

Then, with the portion on which the n-type electrode layer is formed later, the photoresist 76 is formed to cover the portion from the n-GaN buffer layer 61 and n-AlGaN clad layer 62 to the p-type electrode layer 74 (FIG. 11A). And with the photoresist 76 used as a mask, the n-GaN buffer layer 61 is dry-etched (FIG. 11B). Thereafter, at the etched portion of the n-GaN buffer layer 61, the n-type electrode layer 77 is formed (FIG. 11C) and the photoresist 76 is peeled off to obtain a semiconductor light-emitting device 102, as shown in FIG. 11D.

In addition, after forming the p-type electrode layer 74 as shown in FIG. 10A, the GaN substrate 60 is thinned by lapping as shown in FIG. 12A, the n-type electrode layer 78 is formed on the rear surface of the GaN substrate 60, as shown in FIG. 12B, and a semiconductor light-emitting device 103 is obtained. It is noted that since in such event, as shown in FIG. 12A, the mesa portion 80 is located approximately at the center of the semiconductor light-emitting device, in FIG. 8C, the resist pattern 72 is formed nearly at the center of the wafer 200.

Figure 11D:
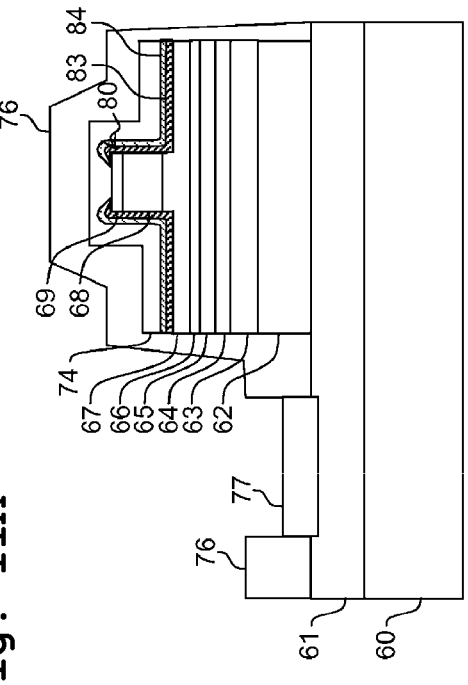
Figure 12A:
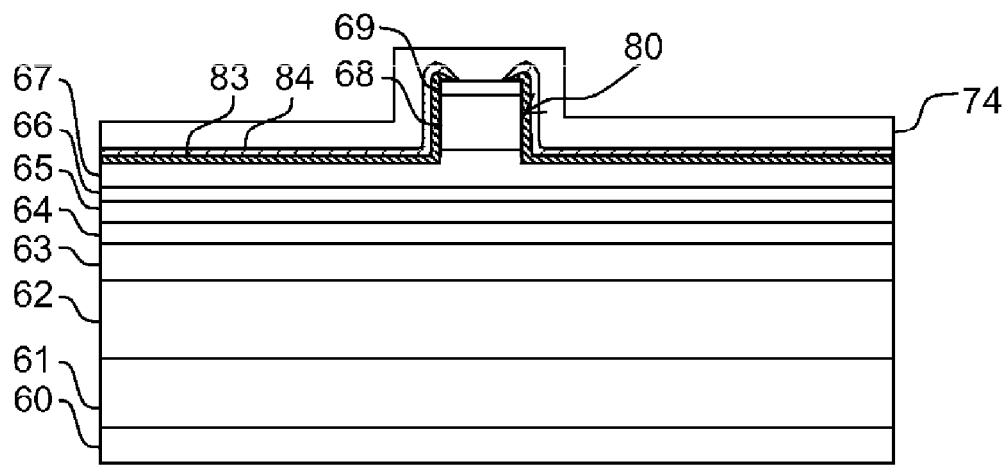
FIGS. 12A and 12B are schematic representations that show a portion of the process to obtain a semiconductor light-emitting device in the method for manufacturing a semiconductor light-emitting device according to another preferred embodiment of the present invention.
Figure 12B:
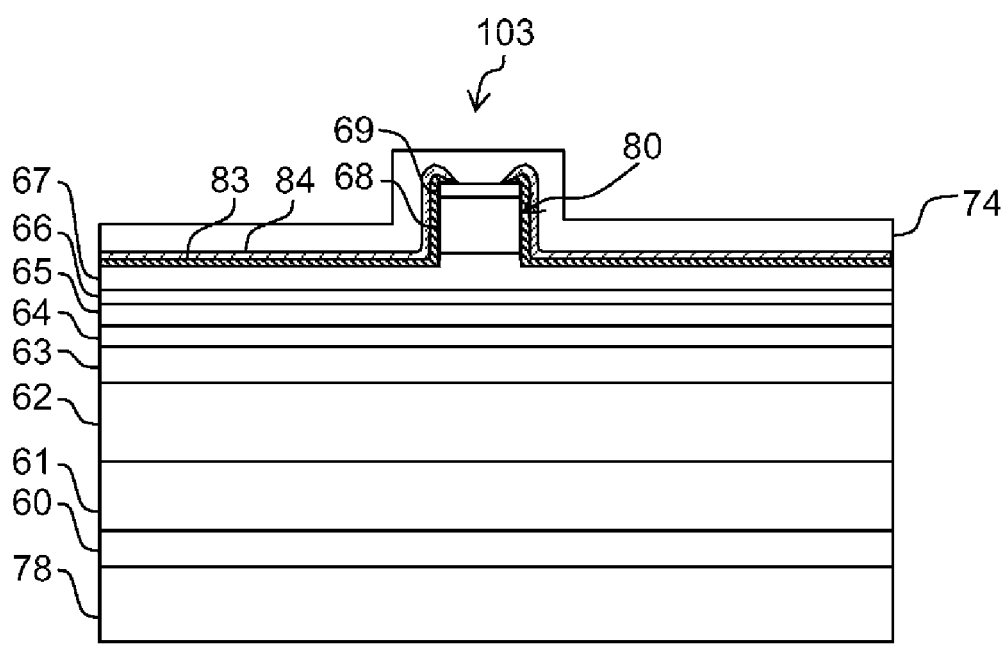
Figure 13:
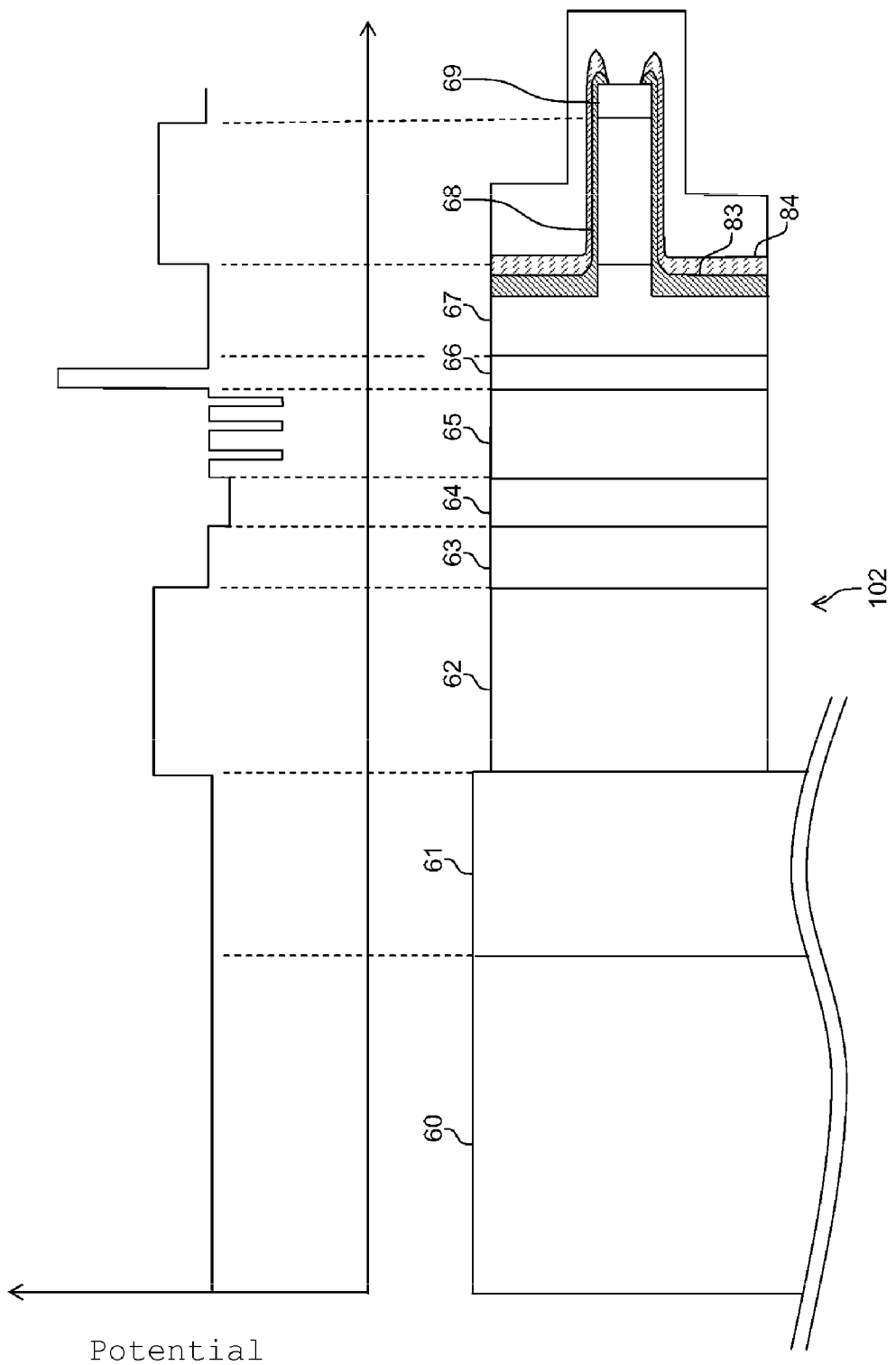
FIG. 13 is a diagram that shows the potential of each layer of the semiconductor light-emitting device.

FIG. 13 shows the potential of each layer of the semiconductor light-emitting device 102 shown in FIG. 11D. By the potential shown in FIG. 13, relative potential of each layer is shown.

The semiconductor light-emitting device according to the preferred embodiments of the present invention can be used as laser diodes for a lighting device, a communication device, a sensor device, a display device, or any other suitable device.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A semiconductor light-emitting device comprising:
   a Group-III nitride-based compound semiconductor expressed by Al$_x$Ga$_y$In$_{1-x-y}$N (where, $0 \leq x \leq 1$; $0 \leq y \leq 1$; $0 \leq x+y \leq 1$) and including a substrate, an n-type semiconductor layer arranged on the substrate, an active layer arranged on the n-type semiconductor layer, and a p-type semiconductor layer arranged on the active layer;
   a mesa portion protruding above the active layer;
   a ZrO$_2$ film arranged to cover the mesa portion from an inner side along an edge of a top surface to a side surface of the mesa portion so as to expose the top surface of the mesa portion;
   an Al$_2$O$_3$ film arranged to cover the ZrO$_2$ film so as to expose the top surface of the mesa portion; and
   an electrode layer arranged to cover the mesa portion from above the ZrO$_2$ film and the Al$_2$O$_3$ film and electrically connected to the p-type semiconductor layer; wherein neither of the ZrO$_2$ film and the Al$_2$O$_3$ film cover a side surface of the active layer below the mesa portion.

2. The semiconductor light-emitting device according to claim 1, wherein a wall surface along the edge of the top surface of the mesa portion of the ZrO$_2$ film and the Al$_2$O$_3$ film is angled towards the top surface of the mesa portion.

3. The semiconductor light-emitting device according to claim 1, wherein the wall surface includes a two-step tiered structure.

4. The semiconductor light-emitting device according to claim 1, wherein a width from the edge of the top surface of the mesa portion where the ZrO$_2$ film and the Al$_2$O$_3$ film come in contact with the top surface of the mesa portion is from about 0 to about 0.5 µm.

5. The semiconductor light-emitting device according to claim 1, wherein the Al$_2$O$_3$ film completely covers a top surface of the ZrO$_2$ film.

* * * * *